(12) United States Patent
Lee et al.

(10) Patent No.: US 11,566,984 B2
(45) Date of Patent: Jan. 31, 2023

(54) METHODS OF MAKING A TUBULAR SPECIMEN WITH A PREDETERMINED WRINKLE DEFECT

(71) Applicant: Bell Textron Inc., Fort Worth, TX (US)

(72) Inventors: Wei-Yueh Lee, Arlington, TX (US); Michael Burnett, Fort Worth, TX (US); Michael Dearman, Weatherford, TX (US)

(73) Assignee: Textron Innovations, Inc., Providence, RI (US)

( * ) Notice: Subject to any disclaimer, the term of this patent is extended or adjusted under 35 U.S.C. 154(b) by 45 days.

(21) Appl. No.: 16/923,413

(22) Filed: Jul. 8, 2020

(65) Prior Publication Data
US 2020/0340894 A1    Oct. 29, 2020

Related U.S. Application Data

(62) Division of application No. 15/464,681, filed on Mar. 21, 2017, now Pat. No. 10,746,640.

(51) Int. Cl.
*G01N 3/08*    (2006.01)
*B29C 70/56*    (2006.01)
(Continued)

(52) U.S. Cl.
CPC ............... *G01N 3/08* (2013.01); *B29C 70/30* (2013.01); *B29C 70/32* (2013.01); *B29C 70/545* (2013.01);
(Continued)

(58) Field of Classification Search
CPC .. G01N 3/02; G01N 3/04; G01N 3/08; G01N 3/22; G01N 2203/0252; G01N 2203/0423;
(Continued)

(56) References Cited

U.S. PATENT DOCUMENTS 2,454,850 A  *  11/1948  Van Winkle .......... G01L 25/003
                                                                      73/856
2,920,480 A  *   1/1960  Haas ....................... G01N 3/06
                                                                      73/787
(Continued)

FOREIGN PATENT DOCUMENTS

CA        2983956 C       8/2020
CA        2983955 C      10/2020
(Continued)

OTHER PUBLICATIONS

Restriction Requirement, dated Jan. 18, 2018, by the USPTO, re U.S. Appl. No. 15/464,681.
(Continued)

*Primary Examiner* — Andrew D Graham
(74) *Attorney, Agent, or Firm* — Timmer Law Group, PLLC

(57) ABSTRACT

A method of offset load testing a tubular composite specimen with two pairs of aligned holes and having at least one defect, the method comprising: providing a testing apparatus having a pair of arms including a fixed arm and a mobile arm; securing the pair of arms using a fastener assembly in each of the two pairs of aligned holes; and moving the mobile arm to impart an offset load force to the tubular specimen. One aspect includes a method of offset load testing comprising: providing a testing apparatus having a pair of arms including a fixed arm and a mobile arm; providing a tubular composite specimen with a top portion and a bottom portion; securing the pair of arms to the top and bottom portions of the tubular composite specimen; and moving the mobile arm to impart an offset load force to the tubular composite specimen.

7 Claims, 17 Drawing Sheets

(51) Int. Cl.
  *G01M 5/00* (2006.01)
  *G01N 3/02* (2006.01)
  *G01N 3/04* (2006.01)
  *B29C 70/32* (2006.01)
  *G06F 30/23* (2020.01)
  *B29C 70/30* (2006.01)
  *B29C 70/54* (2006.01)
  *G01N 3/22* (2006.01)
  *B29L 23/00* (2006.01)

(52) U.S. Cl.
  CPC ......... *B29C 70/56* (2013.01); *G01M 5/0033* (2013.01); *G01M 5/0058* (2013.01); *G01N 3/02* (2013.01); *G01N 3/04* (2013.01); *G01N 3/22* (2013.01); *G06F 30/23* (2020.01); *B29K 2913/00* (2013.01); *B29L 2023/22* (2013.01); *G01N 2203/0017* (2013.01); *G01N 2203/0066* (2013.01); *G01N 2203/0096* (2013.01); *G01N 2203/027* (2013.01); *G01N 2203/0266* (2013.01); *G01N 2203/0274* (2013.01); *G01N 2203/0298* (2013.01)

(58) Field of Classification Search
  CPC ... G01N 2203/0017; G01N 2203/0066; G01N 2203/0274; G01N 2203/027; B29C 70/30; B29C 70/446; G01M 5/0033; G01M 5/0058
  See application file for complete search history.

(56) References Cited

U.S. PATENT DOCUMENTS

| | | | | |
|---|---|---|---|---|
| 3,444,728 A * | 5/1969 | Burns | G01N 3/10 | 73/832 |
| 3,552,193 A * | 1/1971 | Belliveau | G01N 3/02 | 73/771 |
| 3,559,469 A * | 2/1971 | Stonebridge et al. | G01N 3/04 | 73/831 |
| 3,621,711 A * | 11/1971 | Griffith et al. | G01N 3/34 | 73/794 |
| 3,715,916 A * | 2/1973 | Stickney | G01N 3/04 | 73/859 |
| 3,885,424 A * | 5/1975 | Ryckman | G01N 3/08 | 73/860 |
| 3,916,681 A * | 11/1975 | Ryckman | G01N 3/04 | 73/857 |
| 3,938,373 A * | 2/1976 | Fletcher | G01N 3/04 | 73/833 |
| 4,031,746 A * | 6/1977 | Furuta | G01N 3/068 | 73/800 |
| 4,069,088 A * | 1/1978 | Cottam | B65H 59/04 | 156/392 |
| 4,574,642 A * | 3/1986 | Fleischman | G01N 3/32 | 73/799 |
| 4,662,229 A * | 5/1987 | Curtis | G01N 3/04 | 73/859 |
| 4,696,707 A | 9/1987 | Lewis et al. | | |
| 4,780,346 A | 10/1988 | Denoel | | |
| 4,895,027 A * | 1/1990 | Manahan, Sr. | G01N 3/00 | 73/794 |
| 4,895,750 A * | 1/1990 | Pratt | C04B 41/009 | 428/137 |
| 5,054,324 A * | 10/1991 | Pohl | G01N 3/04 | 73/859 |
| 5,056,370 A * | 10/1991 | Maier | G01N 3/08 | 73/794 |
| 5,078,843 A * | 1/1992 | Pratt | C04B 41/5144 | 205/118 |
| 5,275,057 A * | 1/1994 | Alexander | G01B 5/30 | 33/790 |
| 5,286,108 A * | 2/1994 | Whatley | G01N 3/04 | 374/49 |
| 5,292,475 A | 3/1994 | Mead et al. | | |
| 5,374,808 A * | 12/1994 | Coultrip | G01N 3/00 | 219/633 |
| 5,388,464 A * | 2/1995 | Maddison | G01N 3/04 | 73/826 |
| 5,421,207 A * | 6/1995 | Carroll | B23Q 3/186 | 73/856 |
| 5,431,062 A * | 7/1995 | Baratta | G01N 3/04 | 73/856 |
| 5,571,357 A | 11/1996 | Darrieux et al. | | |
| 5,719,339 A * | 2/1998 | Hartman | G01N 3/38 | 73/811 |
| 5,797,551 A * | 8/1998 | Wirz | B65H 54/2884 | 242/418 |
| 5,798,463 A * | 8/1998 | Doudican | G01N 3/08 | 73/796 |
| 6,267,012 B1 * | 7/2001 | McLaughlin | G01N 3/04 | 73/831 |
| 6,460,418 B1 * | 10/2002 | Hiyoshi | G01B 11/16 | 356/35.5 |
| 7,051,600 B1 | 5/2006 | Cavallaro et al. | | |
| 7,150,200 B1 * | 12/2006 | Cavallaro | G01N 3/02 | 73/826 |
| 7,230,421 B2 * | 6/2007 | Goldfine | G01B 7/24 | 324/240 |
| 7,684,596 B2 | 3/2010 | Watson et al. | | |
| 7,770,467 B1 * | 8/2010 | Halderman | G01N 3/04 | 73/856 |
| 8,351,053 B2 * | 1/2013 | Kang | B81C 99/005 | 356/614 |
| 8,365,429 B2 | 2/2013 | Lawrence et al. | | |
| 8,371,036 B2 * | 2/2013 | Lawrence | B29C 66/5221 | 33/562 |
| 8,389,222 B2 | 3/2013 | Breyer et al. | | |
| 8,935,888 B2 * | 1/2015 | Dagher | B29C 70/446 | 52/2.15 |
| 8,950,270 B2 | 2/2015 | Williams et al. | | |
| 9,090,042 B2 | 7/2015 | Elliott et al. | | |
| 9,109,979 B2 * | 8/2015 | Dietrich | B29C 64/40 | |
| 9,222,865 B2 * | 12/2015 | Khonsari | G01N 3/34 | |
| 9,389,155 B1 * | 7/2016 | Rabinovich | C23C 8/22 | |
| 9,440,401 B1 * | 9/2016 | Nelson | B29D 99/0014 | |
| 9,476,815 B2 * | 10/2016 | Khonsari | G01N 3/32 | |
| 9,513,200 B1 * | 12/2016 | Dubke | G01N 3/20 | |
| 10,036,766 B2 * | 7/2018 | Graf | G01R 3/00 | |
| 10,744,727 B2 | 8/2020 | Burnett et al. | | |
| 10,746,640 B2 | 8/2020 | Lee et al. | | |
| 2002/0006523 A1 * | 1/2002 | Obeshaw | B29D 24/004 | 428/593 |
| 2003/0024323 A1 * | 2/2003 | Wang | G01N 3/22 | 73/847 |
| 2003/0054740 A1 * | 3/2003 | Mansky | G01N 3/02 | 451/57 |
| 2003/0236637 A1 * | 12/2003 | Noe | G01N 3/08 | 702/41 |
| 2004/0000188 A1 * | 1/2004 | Mach | G01N 3/12 | 73/49.8 |
| 2004/0031337 A1 * | 2/2004 | Masaniello | G01M 3/246 | 73/865.8 |
| 2004/0040369 A1 * | 3/2004 | Hoo Fatt | G01N 3/30 | 73/12.01 |
| 2005/0109124 A1 * | 5/2005 | Greszczuk | G01N 3/04 | 73/862 |
| 2005/0112304 A1 | 5/2005 | Hsu | | |
| 2005/0252304 A1 * | 11/2005 | Woodward | G01N 3/32 | 73/794 |
| 2005/0268728 A1 * | 12/2005 | Phipps | G01N 3/04 | 73/826 |
| 2006/0162463 A1 * | 7/2006 | Kawano | G01N 3/066 | 73/794 |
| 2007/0151359 A1 * | 7/2007 | Broadley | G01N 3/08 | 73/826 |
| 2007/0175031 A1 | 8/2007 | Pham | | |
| 2007/0277919 A1 | 12/2007 | Savol | | |

(56) References Cited

U.S. PATENT DOCUMENTS

| | | | |
|---|---|---|---|
| 2008/0148865 A1* | 6/2008 | Mlinar | B29C 70/543 73/809 |
| 2009/0007692 A1* | 1/2009 | Ferguson | G01N 3/08 73/831 |
| 2009/0057948 A1* | 3/2009 | Krogager | B29C 70/342 264/258 |
| 2009/0098324 A1 | 4/2009 | Hasegawa | |
| 2009/0166921 A1 | 7/2009 | Jacob | |
| 2009/0199652 A1* | 8/2009 | Wilkinson | G01N 3/08 73/826 |
| 2009/0202767 A1 | 8/2009 | Booker et al. | |
| 2009/0235755 A1* | 9/2009 | Smallwood | G01N 3/04 73/856 |
| 2010/0009124 A1 | 1/2010 | Robins | |
| 2010/0011873 A1* | 1/2010 | Kaneda | G01N 3/02 73/788 |
| 2010/0043957 A1 | 2/2010 | Baril | |
| 2010/0163174 A1 | 7/2010 | Calder et al. | |
| 2011/0094307 A1* | 4/2011 | Seok | G01N 3/20 73/851 |
| 2012/0287248 A1* | 11/2012 | Erdman, III | G01N 3/068 348/47 |
| 2013/0112309 A1 | 5/2013 | Stewart | |
| 2013/0129526 A1* | 5/2013 | Williams | B29C 70/88 156/196 |
| 2013/0156979 A1 | 6/2013 | Stewart | |
| 2013/0160257 A1 | 6/2013 | Feeney | |
| 2013/0164473 A1 | 6/2013 | Feeney | |
| 2013/0164492 A1* | 6/2013 | Hayse | B29B 11/16 428/113 |
| 2013/0188858 A1* | 7/2013 | Lin | G01N 29/4454 382/141 |
| 2013/0298692 A1* | 11/2013 | Seok | G01N 3/62 73/804 |
| 2013/0305833 A1* | 11/2013 | Kittur | G01N 3/32 73/774 |
| 2014/0060732 A1* | 3/2014 | Shair | B32B 37/0053 156/289 |
| 2014/0069203 A1 | 3/2014 | McColskey et al. | |
| 2014/0069576 A1 | 3/2014 | Brown et al. | |
| 2014/0127473 A1* | 5/2014 | Kline | B29C 70/683 428/174 |
| 2014/0131914 A1* | 5/2014 | Gottinger | B29C 70/56 264/163 |
| 2014/0288893 A1* | 9/2014 | Blom | G06F 30/23 703/1 |
| 2014/0352451 A1* | 12/2014 | Kismarton | G01N 3/02 73/826 |
| 2015/0030389 A1 | 1/2015 | Pollett | |
| 2015/0090047 A1* | 4/2015 | De Mattia | G01B 21/32 73/826 |
| 2015/0219539 A1* | 8/2015 | Mary | G01M 5/0075 73/799 |
| 2015/0255407 A1* | 9/2015 | Glacer | H01L 21/32055 73/834 |
| 2016/0031164 A1 | 2/2016 | Downs et al. | |
| 2016/0054205 A1* | 2/2016 | O'Neill | G01N 1/28 73/863 |
| 2016/0139016 A1* | 5/2016 | Kismarton | G06F 30/15 703/1 |
| 2016/0145747 A1* | 5/2016 | Watson | C23C 18/166 205/93 |
| 2016/0282244 A1* | 9/2016 | Li | G01N 3/32 |
| 2016/0318632 A1 | 11/2016 | Froom et al. | |
| 2016/0349160 A1* | 12/2016 | Esposito | G01N 3/18 |
| 2017/0350785 A1* | 12/2017 | Greaves | G01M 5/0033 |
| 2018/0172568 A1* | 6/2018 | Krasnowski | G01N 3/20 |
| 2018/0272629 A1* | 9/2018 | Burnett | B29C 70/56 |
| 2018/0275030 A1* | 9/2018 | Lee | B29C 70/32 |
| 2019/0011254 A1* | 1/2019 | Nielsen | G01N 23/205 |
| 2019/0242799 A1* | 8/2019 | Kuroda | G01N 3/08 |
| 2020/0331216 A1 | 10/2020 | Burnett et al. | |

FOREIGN PATENT DOCUMENTS

| | | |
|---|---|---|
| EP | 3379230 A2 | 9/2018 |
| EP | 3379231 A2 | 9/2018 |
| EP | 3379230 B1 | 7/2019 |
| EP | 3379231 B1 | 7/2019 |
| EP | 3553492 A1 | 10/2019 |
| EP | 3557219 A1 | 10/2019 |
| EP | 3553492 B1 | 8/2020 |
| EP | 3557219 B1 | 8/2020 |
| JP | S6089728 A | 5/1985 |

OTHER PUBLICATIONS

Office Action, dated Jun. 15, 2018, by the USPTO, re U.S. Appl. No. 15/464,681.

Final Rejection, dated Jan. 23, 2019, by the USPTO, re U.S. Appl. No. 15/464,681.

Advisory Action, dated Apr. 9, 2019, by the USPTO, re U.S. Appl. No. 15/464,681.

Office Action, dated Sep. 25, 2019, by the USPTO, re U.S. Appl. No. 15/464,681.

Notice of Allowance, dated Apr. 15, 2020, by the USPTO, re U.S. Appl. No. 15/464,681.

CA Office Action, dated Oct. 5, 2018, by the CIPO, re CA Patent App No. 2,983,956.

CA Office Action, dated Jun. 3, 2019, by the CIPO, re CA Patent App No. 2,983,956.

CA Notice of Allowance, dated Jan. 28, 2020, by the CIPO, re CA Patent App No. 2,983,956.

Partial European Search Report, dated May 2, 2018, by the EPO, re EP Patent Application No. 17197651.7.

EP Communication with Search Report, dated Sep. 3, 2018, by the EPO, re EP Patent App No. 17197651.7.

EP Exam Report, dated Sep. 18, 2018, by the EPO, re EP Patent App No. 17197651.7.

EP Communication under Rule 71(3) EPC—Intention to Grant, by the EPO, dated Apr. 23, 2019, re EP Patent App No. 17197651 7.

Decision to Grant, dated Jul. 4, 2019, by the EPO, re EP App No. 17197651.7.

EP Search Report, dated Sep. 12, 2019, by the EPO, re EP Patent App No. 19179199.5.

EP Exam Report, dated Sep. 24, 2019, by the EPO, re EP Patent App No. 19179199.5.

EP Communication 71(3)—Intention to Grant, dated Apr. 15, 2020, by the EPO re EP App No. 19179199.5.

Restriction Requirement, dated Jun. 7, 2019, by the USPTO, re U.S. Appl. No. 15/464,822.

Office Action, dated Sep. 30, 2019, by the USPTO, re U.S. Appl. No. 15/464,822.

Office Action, dated Jan. 22, 2020, by the USPTO, re U.S. Appl. No. 15/464,822.

Notice of Allowance, dated May 6, 2020, by the USPTO, re U.S. Appl. No. 15/464,822.

CA Office Action, dated Oct. 9, 2018, by the CIPO, re CA Patent App No. 2,983,955.

CA Office Action, dated Jun. 3, 2019, by the CIPO, re CA Patent App No. 2,983,955.

CA Notice of Allowance, dated Jan. 10, 2020, by the CIPO, re CA Patent App No. 2,983,955.

Partial European Search Report, dated May 2, 2018, by the EPO, re EP Patent Application No. 17197650.9.

EP Communication with Search Report, dated Sep. 3, 2018, by the EPO, re EP Patent App No. 17197650.9.

EP Exam Report, dated Sep. 18, 2018, by the EPO, re EP Patent App No. 17197650.9.

EP Communication under Rule 71(3) EPC—Intention to Grant, by the EPO, dated Apr. 26, 2019, re EP Patent App No. 17197650.9.

Decision to Grant, dated Jul. 4, 2019, by the EPO, re EP App No. 17197650.9.

EP Search Report, dated Sep. 12, 2019, by the EPO, re EP Patent App No. 19178452.9.

(56) References Cited

OTHER PUBLICATIONS

EP Exam Report, dated Sep. 24, 2019, by the EPO, re EP Patent App No. 19178452.9.
EP Communication 71(3)—Intent to Granted, dated Apr. 15, 2020, by the EPO re EP App No. 19178452.9.
Burnett et al.; Development of Allowables for Composite Wrinkles—Abstract; submitted Sep. 30, 2016.
Burnett et al.; Development of Allowables for Composite Wrinkles—Abstract; submitted Mar. 27, 2017; presented at the AHS International 73rd Annual Forum & Technology Display; May 9-11, 2017.
Amendment filed with the USPTO on Feb. 27, 2015, regarding U.S. Appl. No. 13/641,290.
Canadian Office Action, dated Jun. 10, 2021, by the CIPO, re CA Patent App No. 3,081,196.
Office Action—Restriction, dated Sep. 21, 2021, by the USPTO, re U.S. Appl. No. 16/922,831.
Office Action, dated Feb. 1, 2022, by the USPTO, re U.S. Appl. No. 16/922,831.

\* cited by examiner

FIG. 3A
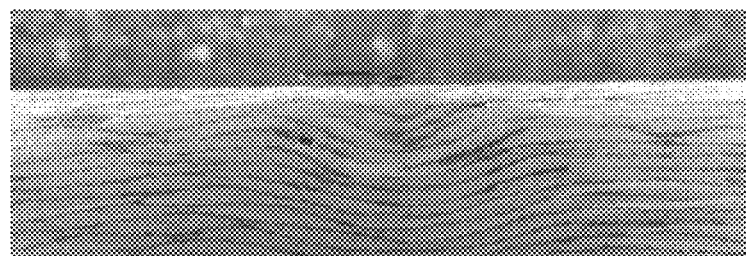
FIG. 3B
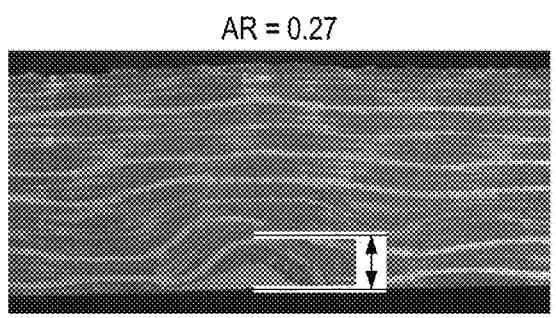
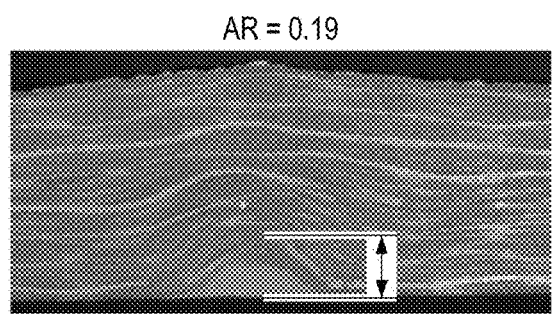
FIG. 4A  FIG. 4B
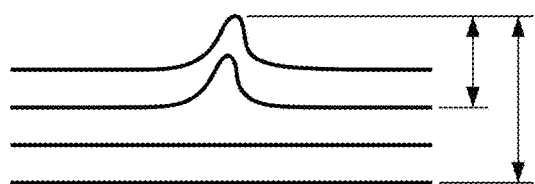
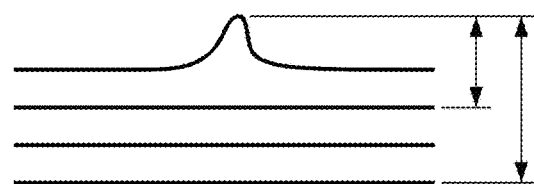
FIG. 4C  FIG. 4D

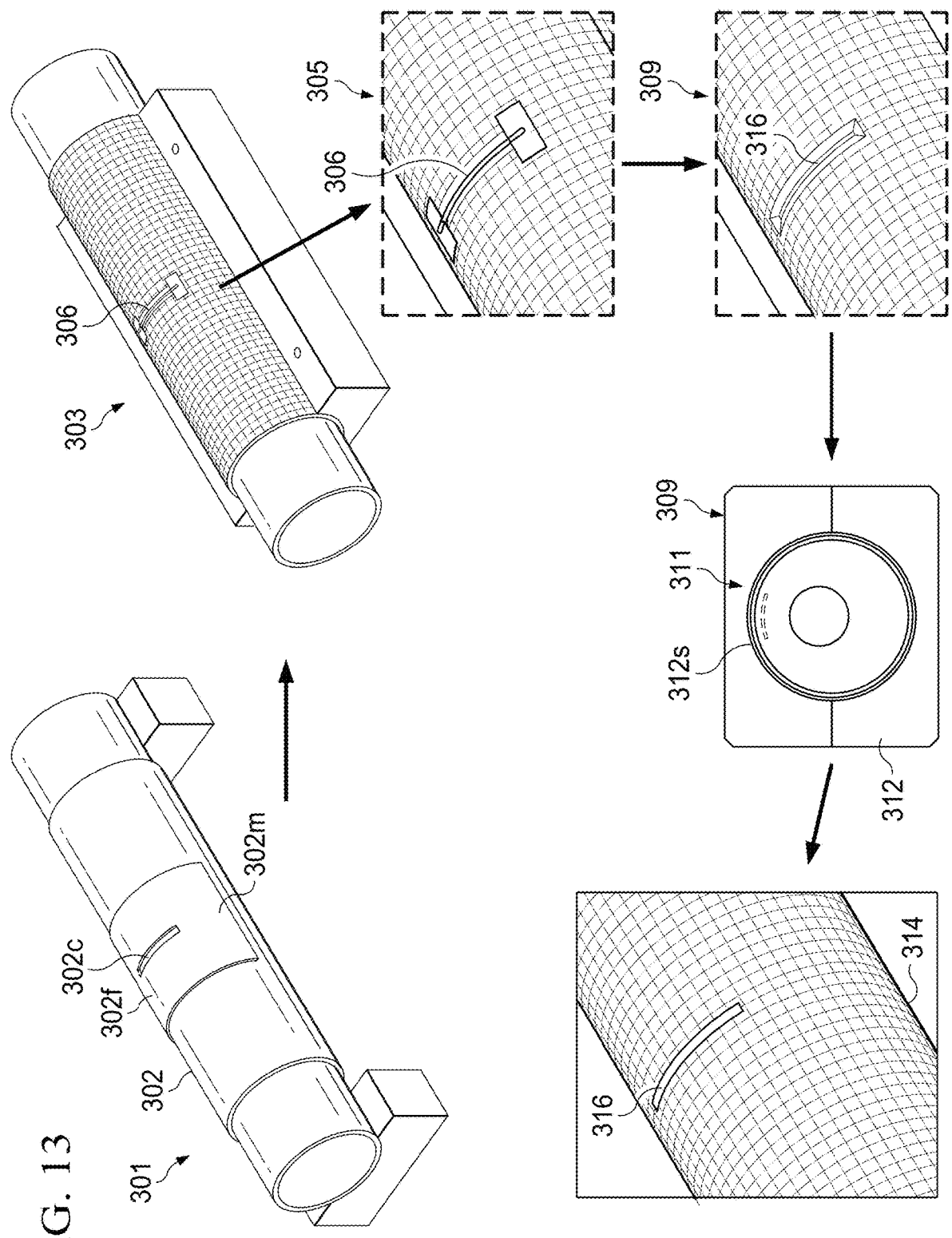

METHODS OF MAKING A TUBULAR SPECIMEN WITH A PREDETERMINED WRINKLE DEFECT

CROSS-REFERENCE TO RELATED APPLICATIONS

This application is a divisional of U.S. patent application Ser. No. 15/464,681, filed Mar. 21, 2017, the disclosure of which is hereby incorporated by reference for all purposes as if fully set forth herein.

BACKGROUND

Technical Field

The present disclosure relates, in general, to the quality testing of composite components and more particularly concerns methods for making a composite specimen that can be used to produce a coupon for which can be used to test the characteristics of the composite laminate.

Description of Related Art

High strength composites in vertical lift aircraft such as rotorcraft can provide weight reduction and improved performance. Composites have been used for a wide range of components with complex geometry and complex laminate configurations. While composite materials have provided improvements in weight, strength, fatigue, and durability for rotorcraft components, composite components can be challenging to manufacture resulting in composite components with defects, e.g., wrinkles, voids, delamination, fiber pull-out, a foreign body, fiber misalignment, and undesirable waviness.

Managing fiber orientation to prevent wrinkles in composite laminates has presented challenges in manufacturing. A wrinkle is an out of plane distortion of the composite's fiber elements. In a laminate wrinkles can weaken the ability of the material to handle a tensile or compressive load, causing a reduction in strength. Composite laminates utilized in rotorcraft are typically made up of high strength fiberglass or carbon fibers in a resin matrix. Properly oriented in-plane fibers provide high tensile strength while the resin provides support and strength for all other loading directions. Fibers can be layered and oriented to meet a required stiffness and strength. When fibers in a laminate deviate (out of plane) from their intended layer and form a wrinkle, there is a strength reduction because the load in the fibers must transition up and around the defect. The more a fiber deviates out of plane, the less it is able to participate in load sharing with the adjacent fibers.

Wrinkles come in many shapes and sizes. FIGS. 2A-2D illustrate several wrinkle defects in composite components including (a) wrinkles protruding outward from the composite structure are shown in FIG. 2A; (b) wrinkles in the interior of a laminate are shown in FIG. 2B; (c) wrinkles on the tooling surface of a laminate are shown in FIG. 2C; and (d) wrinkles protruding into the exterior surface of a laminate are shown in FIG. 2D.

Due to wide variety of shapes and sizes, wrinkles can be difficult to characterize. Three exemplary characteristics that can be used to characterize wrinkles include: wrinkle type, wrinkle Aspect Ratio (AR), and wrinkle depth. An outward wrinkle, shown in FIG. 3A, is a ply deviation that stands out of the surface of the laminate and is typically the less severe form of wrinkle in terms of structural impact. An inward wrinkle, shown in FIG. 3B, forms into the surface of the laminate and can have a greater impact on the laminate strength, because the inward wrinkle affects plies deep into the laminate.

The wrinkle AR is the ratio of wrinkle height to the wrinkle width and measures the severity of the wrinkle. Examples of two different AR's for inward wrinkles are presented in FIGS. 4A-4B. The wrinkle shown in FIG. 4A is an inward wrinkle having a length of 0.033 inch and a width of 0.121 inch, which provides an AR of 0.27. The wrinkle shown in FIG. 4B has an AR of 0.19 with a length of 0.032 inch and width of 0.168 inch.

Another characteristic is the wrinkle depth parameter, as shown in FIGS. 4C and 4D, which is defined as the percentage of laminate thickness affected by the wrinkle (length/thickness). The outward wrinkle shown in FIG. 4C includes is 50 percent of the total laminate thickness, which is more severe than the outward wrinkle in FIG. 4D that is 25 percent of the total laminate thickness.

Composite structures with wrinkles and/or other defects have been tested in the past using costly and tedious processes. The past methods often test full scale parts with defects ("discrepant parts") or subscale parts with inclusions. The full-scale parts are costly and can prove non-conservative as defect and wrinkle location and severity cannot be fully controlled. The subscale parts with inclusions method may simulate ply distortion through a thick laminate but the additional material and subsequent effects through the laminate do not complete represent detrimental effects seen in wrinkled parts. Moreover, these methods generate wrinkles of uncontrollable and inconsistent size and shape resulting in varying severity, occurrence, and distribution. The past methods for producing full scale and subscale parts are typically not representative of real production defects and can be costly and time consuming to manufacture.

Defects in composite components can be difficult to eliminate from the manufacturing process. The occurrence of seemingly random or periodic defects on an assembly line can lead to increased scrap rates, slowed production rates, increased testing requirements, and prolonged manufacturing development time—all of which increase cost.

There is a need for improved methods of making composite specimens with a predetermined wrinkle defect, methods of testing a tubular composite specimen with a defect, and methods of determining allowable defects for a composite component with a defect.

SUMMARY

In a first aspect, there is a method of making a tubular specimen with a predetermined wrinkle defect including: providing a layup tool with a cavity forming member having a cavity which resembles a desired shape of the at least one wrinkle; orienting a composite material around the mandrel at a wrap angle to form a closed loop; and generating at least one wrinkle with a predetermined characteristic in a portion of the closed loop to form a tubular specimen. The predetermined characteristic is at least one of the following: wrinkle location, an outward wrinkle, an inward wrinkle, a wrinkle width, a wrinkle height, and a wrinkle length.

In an embodiment, the cavity is a slot in a forming surface of the layup tool.

In one embodiment, the layup tool is a mandrel.

In another embodiment, the cavity is a slot that extends around the mandrel.

In yet another embodiment, the method includes positioning a wrinkle tool on the closed loop to form a primitive wrinkle. The generating at least one wrinkle step includes deforming a portion of the closed loop around the wrinkle tool to create a wrinkle.

In an embodiment, the wrinkle tool mates with the cavity in the cavity forming member.

In another embodiment, the generating at least one wrinkle step includes curing the closed loop.

In yet another embodiment, the curing step includes compacting the closed loop with a cure tool.

In still another embodiment, after the generating a wrinkle step, the specimen includes an unwrinkled portion adjacent to the wrinkled portion.

In a second aspect, there is a method of making a tubular specimen with a predetermined wrinkle defect including: providing a mandrel; orienting a composite material around the mandrel at a wrap angle to form a closed loop; positioning a wrinkle tool on the closed loop; generating at least one wrinkle by deforming a portion of the closed loop around the wrinkle tool to form a primitive wrinkle in the closed loop; and curing the closed loop to form a tubular specimen. The predetermined characteristic is at least one of the following: an outward wrinkle, an inward wrinkle, a wrinkle width, a wrinkle height, and a wrinkle length.

In a third aspect, there is a method of offset load testing a tubular composite specimen having at least one defect, the method including: providing a testing apparatus having a pair of arms including a fixed arm and a mobile arm; providing the tubular composite specimen with a top portion with a first pair of aligned holes and bottom portion with a second pair of aligned holes; securing the pair of arms using a fastener assembly in each of the first and second pair of aligned holes in the tubular specimen; and moving the mobile arm to impart an offset load force to the tubular specimen.

In an embodiment, the test apparatus is at least one of the following: a tensile testing machine, a compressive testing machine, and a tension-torsion testing machine.

In one embodiment, the defect is at least one of the following: a wrinkle, a delamination, a void, a fiber pull-out, a foreign body, a fiber misalignment, a marcelle, and impact damage.

In another embodiment, the method includes generating at least one defect in the tubular specimen with a predetermined characteristic.

In still another embodiment, the fastener assembly in the securing step is oriented generally about 90 degrees from the longitudinal axis of the mobile arm.

In yet another embodiment, the fastener assembly includes a round rod and a securing fastener.

In an embodiment, the moving of the mobile arm bends the tubular specimen.

In a fourth aspect, there is a method of offset load testing a tubular composite specimen having at least one defect, the method including: providing a testing apparatus having a pair of arms including a fixed arm and a mobile arm; providing the tubular composite specimen with a top portion and a bottom portion; securing the pair of arms to the top and bottom portions of the tubular composite specimen; and moving the mobile arm to impart an offset load force to the tubular composite specimen.

In an embodiment, the securing step includes connecting a fastening assembly to each of the top and bottom portions of the tubular composite specimen.

In a fifth aspect, there is a method of determining allowable defects for a composite component including: identifying at least one wrinkle characteristic of a composite component wrinkle defect; making a first plurality of tubular specimens each having a predetermined wrinkle defect representative of the composite component wrinkle defect; measuring each of the predetermined wrinkle defects in the first plurality of tubular specimens for at least one performance metric to generate performance data; and generating an allowable wrinkle defect profile based on the performance data from the first plurality of tubular specimens.

In an embodiment, the step of measuring is uses the methods of offset loading a specimen described herein.

In another embodiment, the predetermined wrinkle defect has at least one predetermined physical characteristic representative of a physical characteristic of the composite component wrinkle defect.

In one embodiment, the predetermined physical characteristic and physical characteristic are each at least one of the following: a wrinkle shape, a wrinkle width, a wrinkle height, and a wrinkle length.

Other aspects, features, and advantages will become apparent from the following detailed description when taken in conjunction with the accompanying drawings, which are a part of this disclosure and which illustrate, by way of example, principles of the inventions disclosed.

DESCRIPTION OF THE DRAWINGS

The novel features believed characteristic of the embodiments of the present disclosure are set forth in the appended claims. However, the embodiments themselves, as well as a preferred mode of use, and further objectives and advantages thereof, will best be understood by reference to the following detailed description when read in conjunction with the accompanying drawings, wherein:

FIGS. 3A-3B are photographs of wrinkles having various shapes;

FIGS. 4A-4B are photographs of wrinkles having various aspect ratios;

FIGS. 4C-4D are schematic illustrations of composite laminates having an outward wrinkle thickness as a portion of the total composite thickness;

FIG. 13 is a top level schematic view diagram of methods of making a tubular specimen with a predetermined wrinkle defect in accordance with exemplary embodiments of the present disclosure;

DESCRIPTION OF THE PREFERRED EMBODIMENT

Illustrative embodiments of the apparatus and method are described below. In the interest of clarity, all features of an actual implementation may not be described in this specification. It will of course be appreciated that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

In the specification, reference may be made to the spatial relationships between various components and to the spatial orientation of various aspects of components as the devices are depicted in the attached drawings. However, as will be recognized by those skilled in the art after a complete reading of the present application, the devices, members, apparatuses, etc. described herein may be positioned in any desired orientation. Thus, the use of terms such as "above," "below," "upper," "lower," or other like terms to describe a spatial relationship between various components or to describe the spatial orientation of aspects of such components should be understood to describe a relative relationship between the components or a spatial orientation of aspects of such components, respectively, as the device described herein may be oriented in any desired direction.

Figure 1:
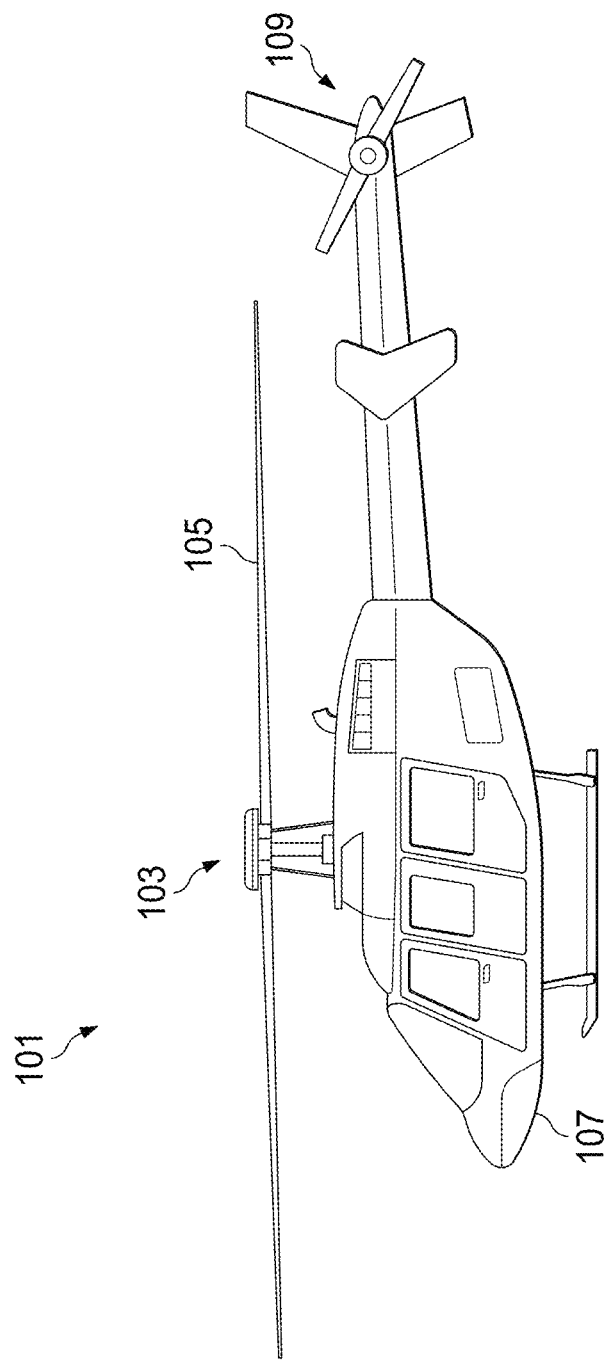
FIG. 1 is a schematic side view of helicopter in accordance with an exemplary embodiment of the present disclosure.
Figure 2B:
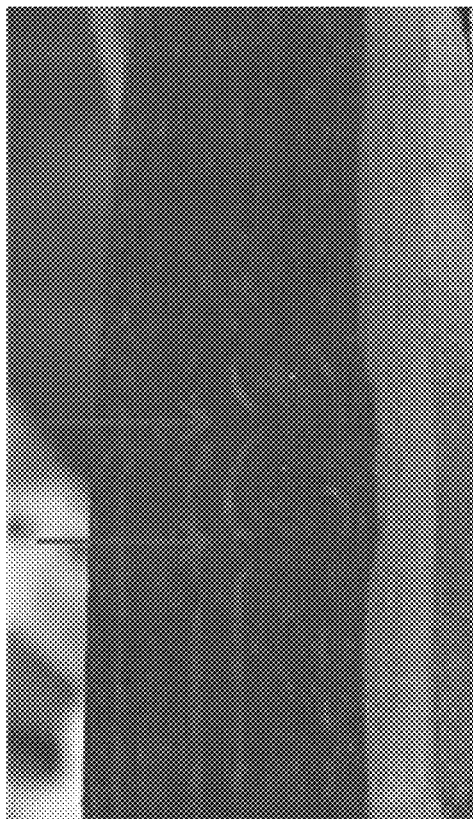
FIGS. 2A-2D are photographs of types of wrinkles in composite components.
Figure 2A:
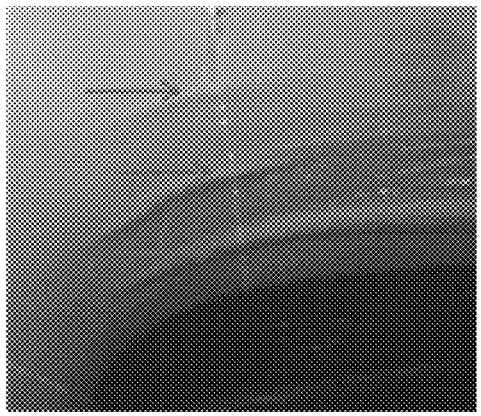
Figure 2D:
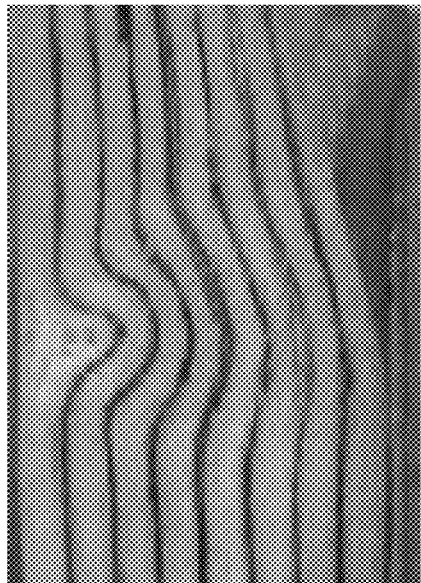
Figure 2C:
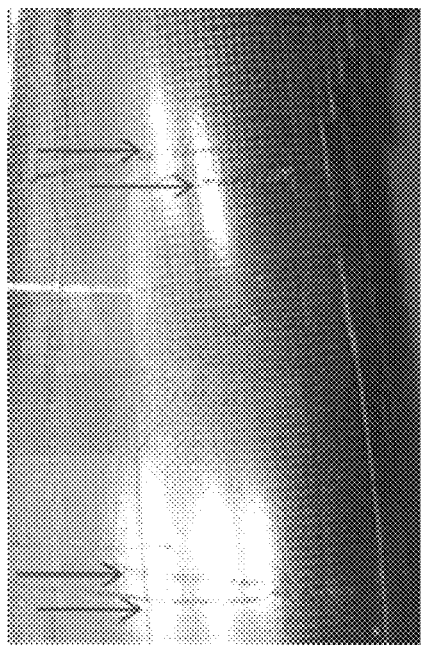

Referring now to FIG. 1 in the drawings, a rotorcraft 101 is illustrated. Rotorcraft 101 can have a rotor system 103 with a plurality of rotor blades 105. The pitch of each rotor blade 105 can be manipulated in order to selectively control direction, thrust, and lift of rotorcraft 101. The rotorcraft 101 can further include a fuselage 107, and anti-torque system 109. The structure of rotorcraft 101 can include a variety of airframe components, such as bulkheads, ribs, longerons, stringers, keels, skins, spars to name a few examples.

The methods and systems of the present disclosure relate to methods of making composite specimens, methods of offset load testing of composite specimens, and methods of determining allowable defects for a composite component with a defect, such as a rotorcraft composite component or structure. It should be appreciated that rotorcraft 101 is merely illustrative as one of the many different types of aircraft whose composite components can benefit from the methods of the present disclosure. Furthermore, other aircraft can include, fixed wing aircraft, hybrid aircraft, unmanned aircraft, tiltrotor aircraft, to name a few examples. Moreover, composite components used in land, sea, and medical applications can benefit from the methods of the present disclosure.

Figure 5A:
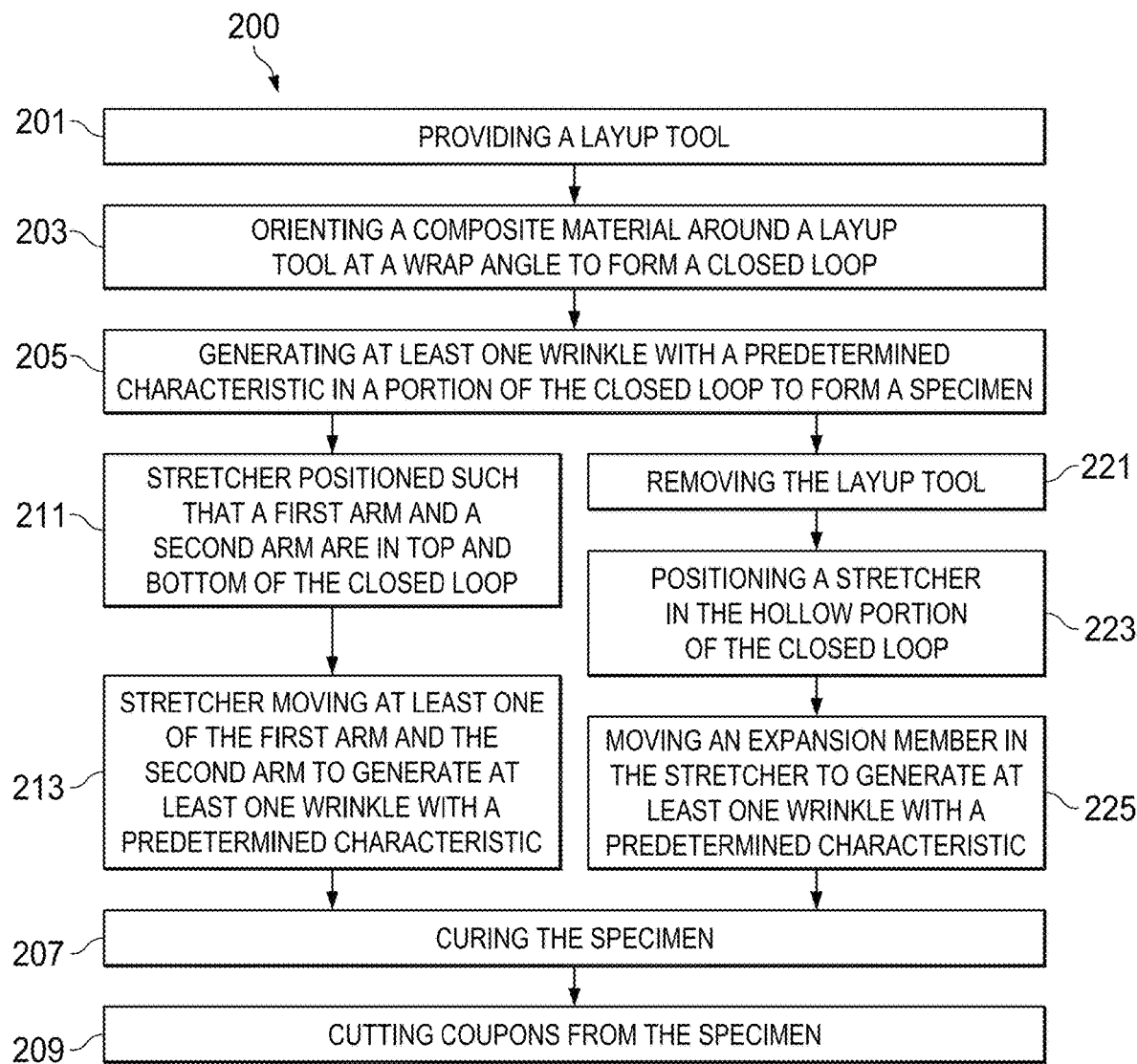
FIG. 5A is a flowchart illustrating methods of making a specimen with a predetermined wrinkle defect in accordance with exemplary embodiments of the present disclosure.

Referring now to FIG. 5A, a method 200 of making a specimen with a predetermined wrinkle defect is illustrated. In one embodiment, the method 200 is a method of making a composite specimen with a predetermined wrinkle defect from a composite material. Applicable composite materials can be made from a fiber that is composed of continuous filaments or fibers including one or more of glass, carbon, graphite, basalt, an aromatic polyamide (i.e. "aramid") material, a variant of an aromatic polyamide material (e.g., a polyparaphenylene terephthalamide material, such as Kevlar® by E.I. du Pont de Nemours and Company of Richmond, Va.), or the like. However, the continuous filaments or fibers described herein can include any suitable material or combination of materials. The fibers can be oriented as a fabric, tape, and/or a braid. In an embodiment, the fabric is a woven fabric. In another embodiment, the tape is a unidirectional tape.

In an embodiment, the fibers can be pre-impregnated with an un-cured resin. The resin can be a polymeric matrix or any suitable resin system, such as a thermosetting resin. Other exemplary resins can include epoxy, polyimide, polyamide, bismaleimide, polyester, vinyl ester, phenolic, polyetheretherketone (PEEK), polyetherketone (PEK), polyphenylene sulfide (PPS), and the like. It should be appreciated that even though the methods herein are described with resin impregnated fibers, other composite manufacturing processes may be used. For example, a resin transfer molding process, which involves fibers, being placed in a selected pattern within a mold and resin is transferred into the mold such that the fibers and resin are combined, and then cured.

It will be appreciated that the embodiments described herein illustrate specimens with a predetermined wrinkle defect made from composite materials. In other embodiments, specimens and components made from metallic materials, polymeric materials, and other materials having wrinkle defects and other manufacturing defects can use and benefit from the methods and systems in the present disclosure.

The method 200 can include a step 201 of providing a layup tool, a step 203 of orienting a composite material around a layup tool at a wrap angle to form a closed loop, a step 205 of generating at least one wrinkle with a predetermined characteristic in a portion of the closed loop to form a specimen, a step 207 of curing the specimen, and a step 209 of cutting coupons from the specimen. In an embodiment, the predetermined characteristic can include at least one of the following: a wrinkle location, an outward wrinkle, an inward wrinkle, a wrinkle width, wrinkle height, and a wrinkle length. The method 200 can advantageously provide a specimen that can be used to test edge effect defects. Each of these steps are described herein in further detail.

The step 201 of providing a layup tool can be a mold or mandrel of a suitable shape. In some embodiments, the layup tool has a generally rectangular, cuboid, or tubular shape.

The step 203 includes orienting a composite material around the layup tool to form a closed loop. In one embodiment, the composite material may comprise numerous plies of fabric and/or tape and a user or a machine can direct the plies to be laid down or wrapped around the layup tool to form a closed loop. In other embodiments, the composite material can be laid down in other configurations, for example, and not limitation, a tubular shape, and a rectangular shape. The composite material plies may form a plurality of plies having a substantially homogeneous height, weight, and length. In some embodiments, a glue may be applied above each ply and subsequently cured such that a layer of glue separates each pair of consecutive plies.

The user can control the orientation of the fibers in each ply when laying down each ply of fabric and/or tape. The step 203 of orienting a composite material around the layup tool at a wrap angle, which can be a fiber orientation angle. The fiber orientation angle can be associated with each ply of fabric and/or tape and may comprise any value. In one embodiment, the first ply comprises a fiber orientation angle of +45 degrees and the second ply comprises a fiber orientation angle of −45 degrees. In an embodiment, a third ply comprises a fiber orientation angle of 0 degrees. The plurality of plies can have the same or different fiber orientation angles associated with the other plies. The various angles of the several fiber orientation angles may be arranged in a repeating pattern. The fiber orientation angles described herein are merely exemplary and can be arranged in an infinite number of configurations.

The step 205 of generating at least one wrinkle with a predetermined characteristic can be accomplished with a variety of devices that can impart tension from a first point on the closed loop to second point on the closed loop. In one embodiment, a stretcher is configured to generate at least one predetermined wrinkle in the closed loop.

Figure 5B:
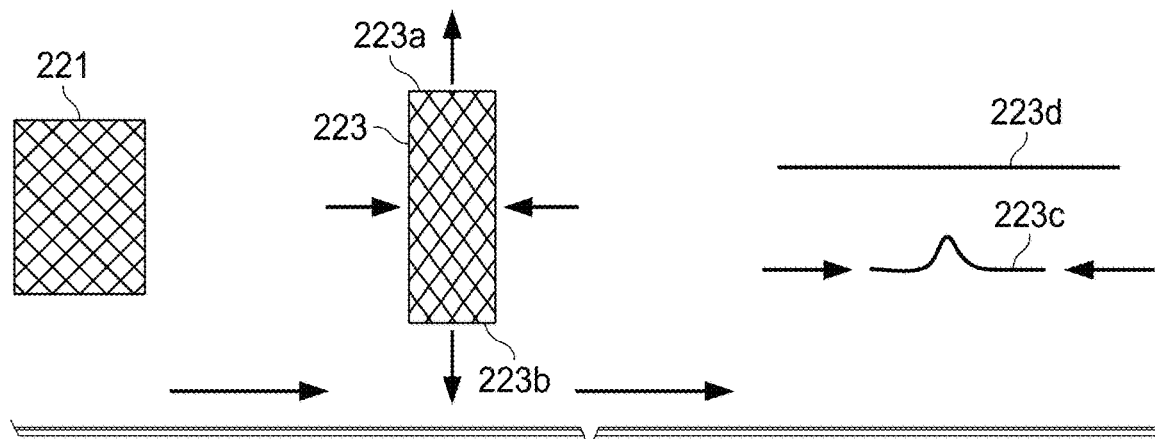
FIG. 5B is a schematic illustration of a method of generating at least one wrinkle with a predetermined characteristic in accordance with exemplary embodiments of the present disclosure.

In one embodiment, the step 205 of generating at least one wrinkle defect can produce wrinkles as shown in FIG. 5B. A plurality of plies prior to generation of a wrinkle 221 can have a wrap angle of plus/minus 45 degrees. When tension is imparted on a first point 223a and a second point 223b pulling the plurality of plies 221 in opposite directions, the plies with a wrap angle of plus/minus 45 degrees tend to "scissor" while the adjacent plies at an angle of 0 degrees are forced to contract causing a stretched plurality of plies 223.

This contraction, forces fibers out of the wrap angle and can create at least one predetermined wrinkle. In one embodiment, the plies with a wrap angle of plus/minus 45 degrees 223d can have a scissor movement and remain planar or wrinkle-free while the adjacent ply or plies at 0 degrees 223c can have a wrinkle. In other embodiments, the wrinkle can be severe and extend in the plies with a wrap angle of plus/minus 45 degrees and the ply or plies at 0 degrees.

Figure 6A:
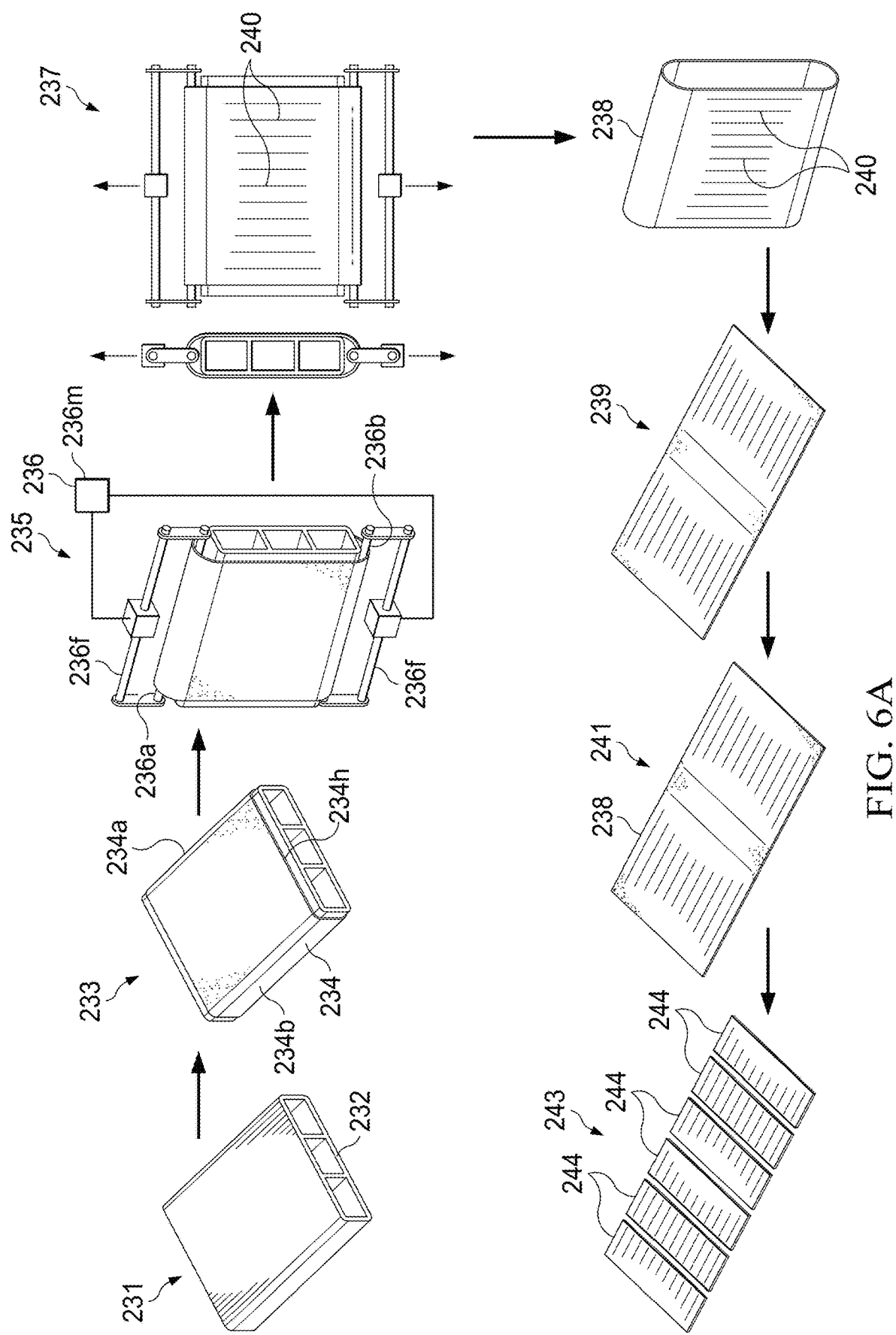
FIGS. 6A, 6B, and 6C are top level schematic view diagrams of methods of making a specimen with a predetermined wrinkle defect in accordance with exemplary embodiments of the present disclosures.

In one implementation, the step 205 for generating at least one wrinkle with a predetermined characteristic can include a stretcher that imparts tension between two points on or in the closed loop. In one embodiment, the stretcher can include an actuating mechanism in mechanical communication with a first arm and second arm. In step 211 the stretcher can be positioned such that the first and second arms are each in either the top or bottom portion of the closed loop. In step 213 at least one of the first and second arms is moved to generate at least one wrinkle with a predetermined characteristic. In an exemplary embodiment, the stretcher with an actuating mechanism is shown in FIG. 6A, which will be described in further detail herein.

Figure 6B:
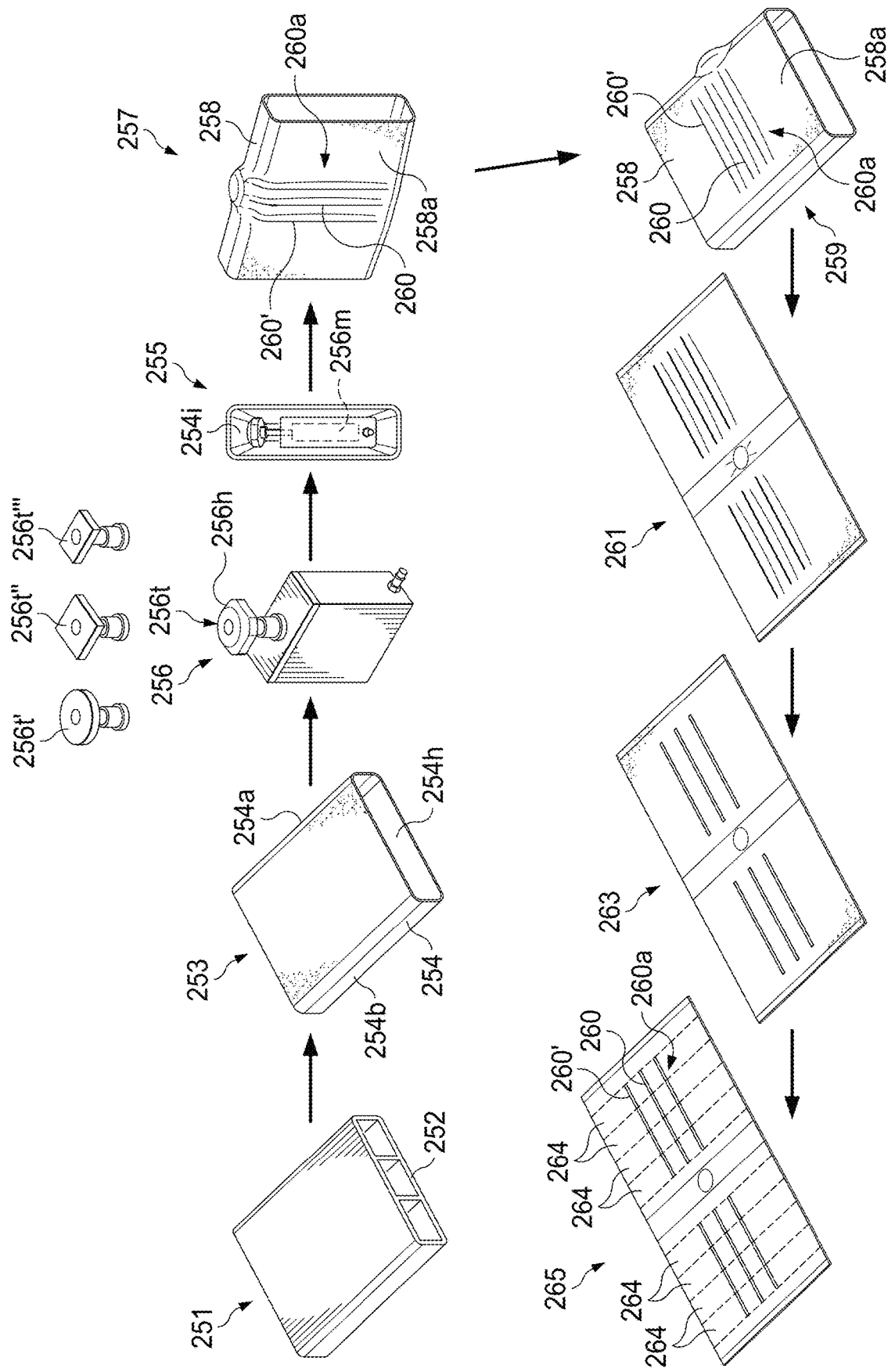

In another embodiment, step for 205 for generating at least one wrinkle with a predetermined characteristic can include the step of removing 221 the layup tool, the step of positioning 223 a stretcher in the hollow portion of the closed loop, and the step of moving 225 an expansion member to impart deformation to a portion of the closed loop. In an exemplary embodiment, the stretcher with an expansion member is shown in FIG. 6B.

Step 205 of generating at least one wrinkle with a predetermined characteristic in the closed loop forms the specimen. The generation of the wrinkle with a predetermined characteristic can have one of many characteristics including at least one of the following: a wrinkle location, an outward wrinkle, an inward wrinkle, a wrinkle width, a wrinkle height, and a wrinkle length. In an embodiment, the step 205 of generating at least one wrinkle generates a plurality of wrinkles.

Once the specimen is formed with at least one wrinkle having a predetermined characteristic, the specimen is cured in step 207 and then cut into coupons in step 209 for measuring various properties of the specimen. In an embodiment, the at least one wrinkle is filled with a resin similar to the manufacture of a composite component.

FIG. 6A is an exemplary embodiment of the method 200 including a stretcher 236 with an actuating mechanism 236m and a pair of arms 236a, 236b. Step 231 includes providing a rectangular layup tool 232 and step 233 includes orienting a composite material around the rectangular tool 232 to form a closed loop 234. In an embodiment, the composite material includes 12 plies including three sets of ply orientations having a −45 degrees ply, a +45 degrees ply, a 0 degrees ply, and a 90 degrees ply. The closed loop 234 can have a generally flat oval cross-sectional shape and include a top arcuate portion 234a, a bottom arcuate portion 234b, and a hollow portion 234h between the top and bottom arcuate portions 234a, 234b.

A stretcher 236 can be proved in step 235 that includes an actuating mechanism 236m in mechanical communication with a first arm 236a and a second arm 236b. The first and second arms 236a, 236b can be a portion of frame 236f that is in mechanical communication with the actuating mechanism 236m. In an embodiment, the actuation mechanism can be a tensile test machine or tension load frame.

The step 237 of generating a wrinkle with a predetermined characteristic in a portion of the closed loop to form a specimen 238 can include positioning the first arm 236a in the top arcuate portion 234a of the closed loop and a second arm 236b in the bottom arcuate portion 234b. The actuating mechanism 236m mechanically moves at least one of the first arm 236a and the second arm 236b sufficient to form at least one wrinkle 240 in the closed loop 234 to form a specimen 238. In an exemplary embodiment, the actuating mechanism 236m moved the first arm 236a 0.5 inches and the second arm 236b 0.0 inches, which resulted in the desired outward wrinkles 240 in an area having a width of up to 12 inches and depth of up to 8 inches.

Once the specimen 238 is formed, the specimen 238 can be cut into a flat specimen 238 in step 239 and cured in step 241. In an embodiment, a plurality of coupons 244 including a portion of the at least one wrinkle 240 with a predetermined characteristic are there identified in the flat specimen 238a and cut in step 243. The coupons then undergo measurement for various physical and structural properties that can be related to performance of a composite component with a defect.

Referring now to FIG. 6B another exemplary embodiment of the method 200 is shown including stretcher 256 with an expansion member 256t. Step 251 includes providing a rectangular layup tool 252 and step 253 includes orienting a composite material around the rectangular tool 252 to form a closed loop 254. In an embodiment, the composite material includes 12 plies having 4 sets of plies at the following wrap angles: a −45 degrees ply, a +45 degrees ply, and a 0 degrees ply. The closed loop 254 can have a generally flat oval cross-sectional shape and includes a top arcuate portion 254a, a bottom arcuate portion 254b, and a hollow portion 254h between the top and bottom arcuate portions 254a, 254b. Step 253 includes removing the layup tool 252 after the closed loop 254 has been formed.

A stretcher 256 can be provided in step 255 that includes an expansion member 256t in mechanical communication with an actuating mechanism 256m. In an embodiment, the stretcher 256 can be a pneumatic actuator or air cylinder. The expansion member 256t includes a head portion 256h. FIG. 6B shows the head portion 256h as having an outer dimensional shape of a square with rounded corners. The rounded corners of the head portion 256h can be cut away, as shown in FIG. 6B, or curved. In other embodiments, the outer dimensional orientation of the head portion 256h can be round 256t', square 256t", rectangular 256t'", and other shapes sufficient to generate a wrinkle 260 having a predetermined characteristic in the closed loop 254; for example, and not limitation, the outer dimensional orientation of the expansion member 256t can have an irregular shape.

The step 257 of generating a wrinkle with a predetermined characteristic in a portion of the closed loop 254 to form a specimen 258 can include positioning the stretcher 256 in the hollow portion 254h such that the expansion member 256t contacts an interior surface 254i of the closed loop 254. The actuating mechanism 256m moves the expansion member 256t sufficient to impart deformation to the closed loop 254 thereby generating at least one wrinkle having a predetermined characteristic in a portion of the closed loop 254 to form a specimen 258. In an embodiment, the expansion member 256t moves 0.5 inches in an upwards direction to generate a plurality of outward wrinkles 260a having a width of up to 3 inches and depth of up to 8 inches.

Figure 9A:
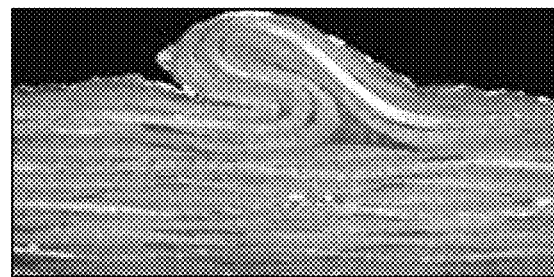
FIGS. 9A and 9B are photographs of outward wrinkles in accordance with exemplary embodiments of the present disclosure.
Figure 9B:
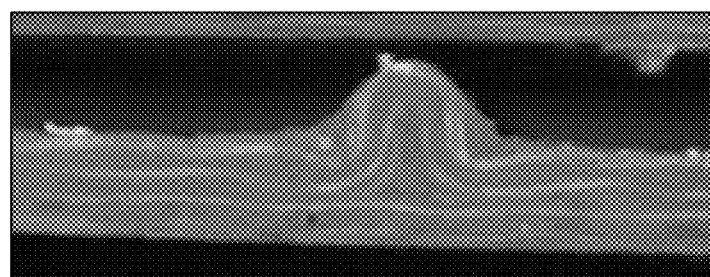
Figure 10:
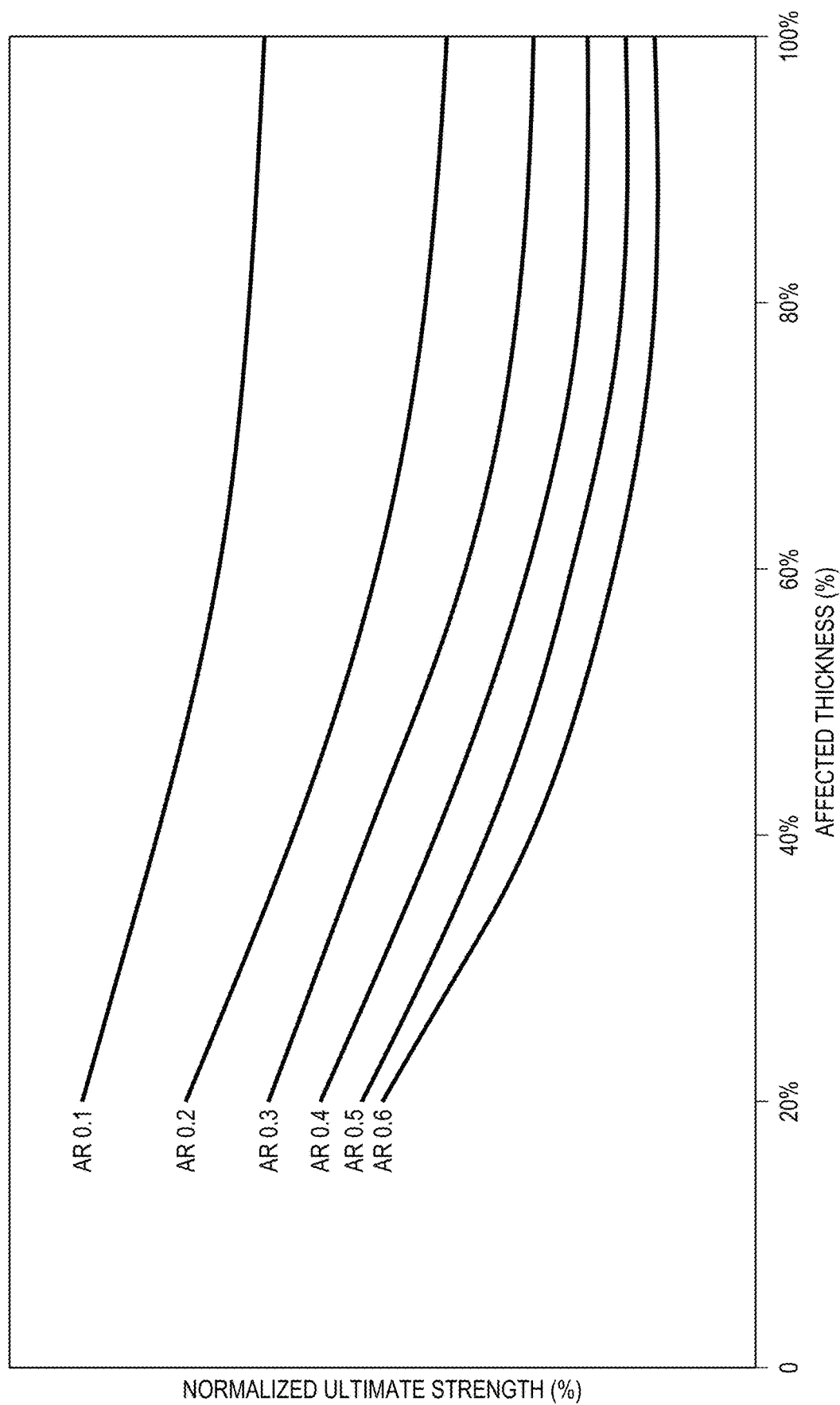
FIG. 10 is a graph of an allowable wrinkle defect profile in accordance with exemplary embodiments of the present disclosure.

In one embodiment, the expansion member 256t can have an outer dimensional shape that generates a wrinkle with a predetermined characteristic. The outer dimensional shape of the head portion 256h of the expansion member 256t can surprisingly impart desired shapes to a plurality of wrinkles 260a. For example, as shown in FIG. 6B, the expansion member 256t generates outward wrinkles 260, 260', which are shown in FIGS. 9A and 9B. The shape of the expansion member 256t can generate from one to three outward wrinkles. In other embodiments, an expansion member with a round outer dimensional shape 256t' can generate one or two wrinkles; an expansion member with a square outer dimensional shape 256t" can generate one to three wrinkles and varies dependent on the shape of the corner orientation (standard square corners, rounded corners as either cut-away or curved); and an expansion member 256t with a rectangular outer dimensional shape 256t'" can generate a plurality of wrinkles 260a along its length. The shape of the expansion member can generate outward and/or inward wrinkles. In an embodiment, the expansion member 256t generates a plurality of outward wrinkles 260a shown in FIG. 6B and shown in FIGS. 9A, 9B.

In an embodiment, the specimen 258 can include an unwrinkled portion 258a adjacent to the wrinkle 260. In an embodiment, the unwrinkled portion 258a are layers adjacent to and above or below the wrinkle 260. In one embodiment, there is included an additional step of adding unwrinkled composite material to the specimen 258, which can be used to tailor the specimen to be representative of a composite component defect, which is described in further detail herein. FIGS. 9A and 9B are examples of generated wrinkles with a predetermined outward wrinkle shape and having a predetermined thickness adjacent to unwrinkled composite material. The wrinkle in FIG. 9A was generated to achieve the desired predetermined outward characteristic having about 25% of the plies wrinkled and 75% of the adjacent plies unwrinkled. The wrinkle in FIG. 9B was generated to achieve the desired predetermined outward characteristic having about 50% of the plies wrinkled adjacent to 50% of the adjacent plies unwrinkled.

Once the specimen 258 is formed, the stretcher 256 is removed in step 259, the specimen 258 is cut into a flat specimen 258b in step 261, and the specimen is cured in step 263. In an embodiment, a plurality of coupons 264 including a portion of the at least one wrinkle 260, 260' with a predetermined characteristic are identified in the flat specimen 258a and cut in step 265. The plurality of coupons 264 then undergo measurement for various physical and structural properties that can be related to performance of and representative of a composite component with a wrinkle defect, which is described in further detail herein.

Figure 6C:
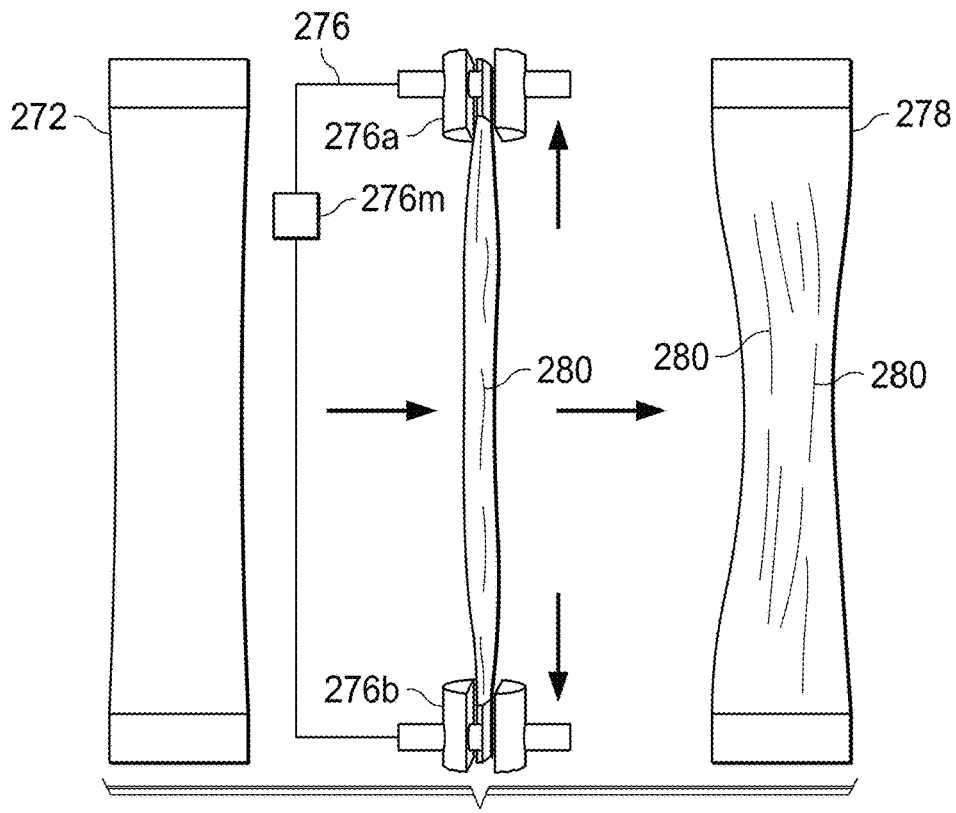
Figure 6D:
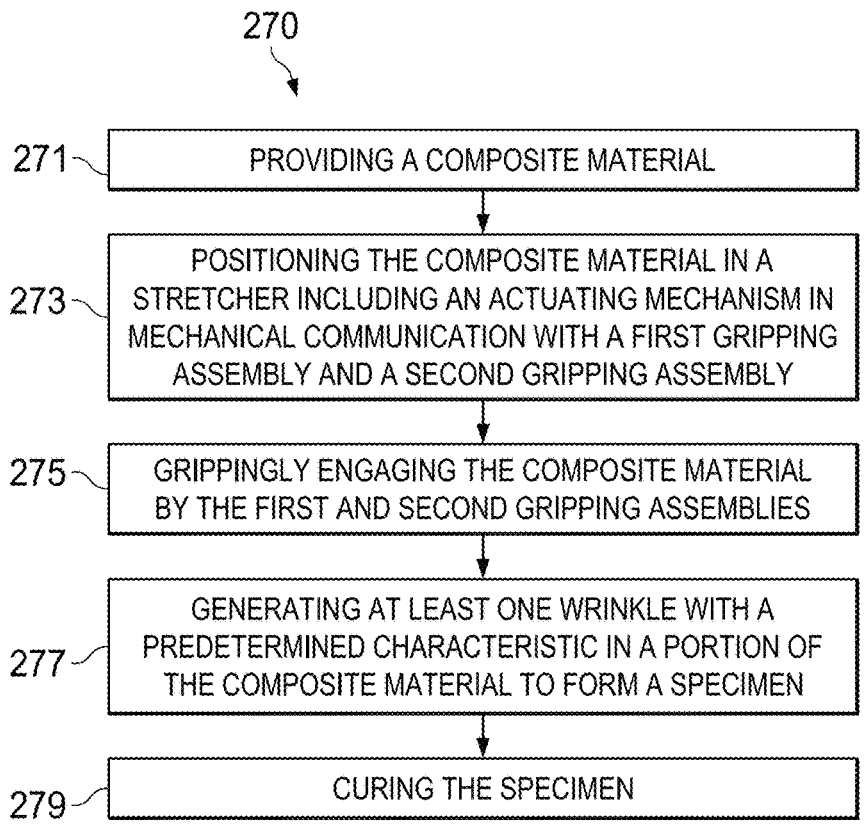
FIG. 6D is a flowchart illustrating a method of making a specimen with a predetermined wrinkle defect in accordance with exemplary embodiments of the present disclosure.

In another embodiment, shown in FIGS. 6C and 6D, there is a method of making a specimen 270 with a predetermined wrinkle defect including: the step 271 of providing a composite material 272; the step 273 of positioning the composite material 272 in a stretcher 276 having an actuating mechanism 276m in mechanical communication with first and second gripping assemblies 276a, 276b; the step of 275 grippingly engaging the composite material 272 by the first and second gripping assemblies 276a, 276b; the step 277 of generating at least one wrinkle 280 with a predetermined characteristic in a portion of the composite material 272 to form a specimen 278; and the step 279 of curing the specimen 278. The stretcher 276 can be used to generate at least one wrinkle by using the actuating mechanism 276m to move at least one of the gripping assemblies 276a, 276b to provide tension, as shown in FIG. 6C, that causes the composite material 272 to deform such that at least one wrinkle 280 with a predetermined characteristic is formed. In an embodiment, the stretcher 276 can provide a compressive force to the composite material 272 to generate at least one wrinkle by moving at least one of the gripping assemblies 276a, 276b toward the opposite gripping assembly 276a, 276b.

In an exemplary embodiment, the coupons 244, 264, 278 each have wrinkle 240, 260, 280 with a predetermined characteristic that can be characterized and measured quantitively and qualitatively. The coupons 244, 264, 278 can each be fabricated using the methods shown in FIGS. 5-6D to have varying or a range of predetermined characteristics to investigate notable trends, physical properties, structural properties, and performance metrics, e.g., varying wrinkle types, AR's and lengths, which can be used to generate performance data. In an embodiment, the composite material can be a closed loop as described herein.

Figure 7A:
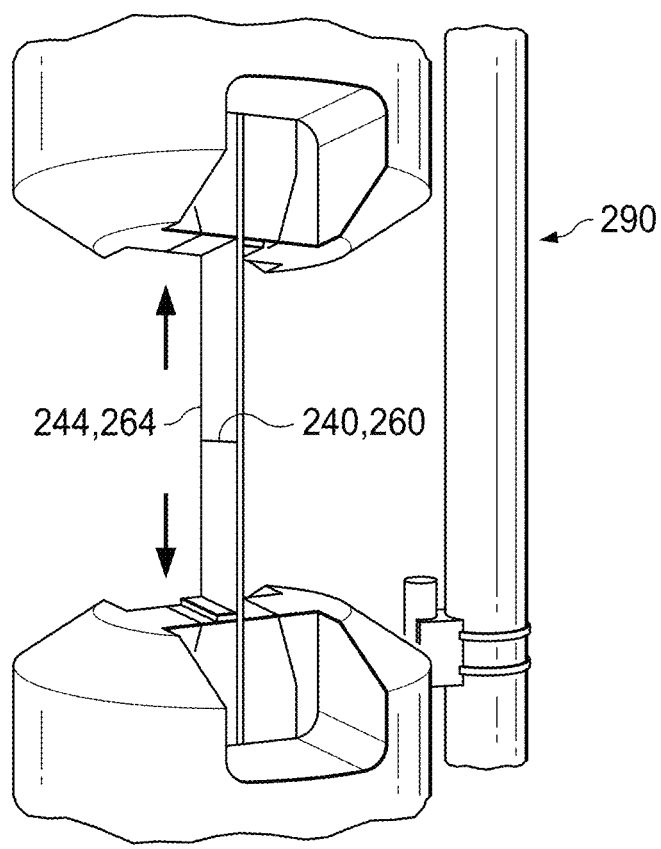
FIG. 7A is a perspective view of coupon with a predetermined wrinkle defect measured in a testing apparatus in accordance with exemplary embodiments of the present disclosure.

Regarding the methods shown in FIGS. 6A and 6B, a plurality of specimens 238, 258 were fabricated such that each included at least one wrinkle having a predetermined characteristic that was in the range of the maximum and minimum AR for wrinkle defects generally seen in conventional composite fabrication for a rotorcraft 101. A plurality of coupons 244, 264 were then manufactured using the ASTM D3039 standard. FIG. 7A shows a testing apparatus 290, which can be a standard tensile test machine such as a MTS Tensile Testing Machine. The coupons 244, 264 were tested in static tension until failure (cracking) in a testing apparatus 290.

Figure 7B:
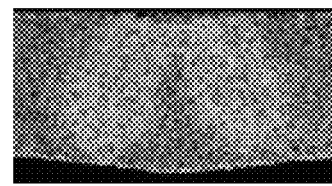
FIGS. 7B, 7C, and 7D are photographs of a free edge of a coupon with an inward wrinkle under increasing tension loads in accordance with exemplary embodiments of the present disclosure.
Figure 7C:
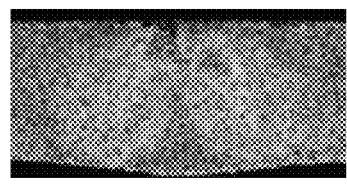
Figure 7D:
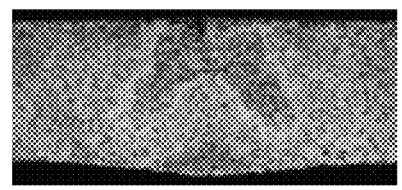
Figure 8:
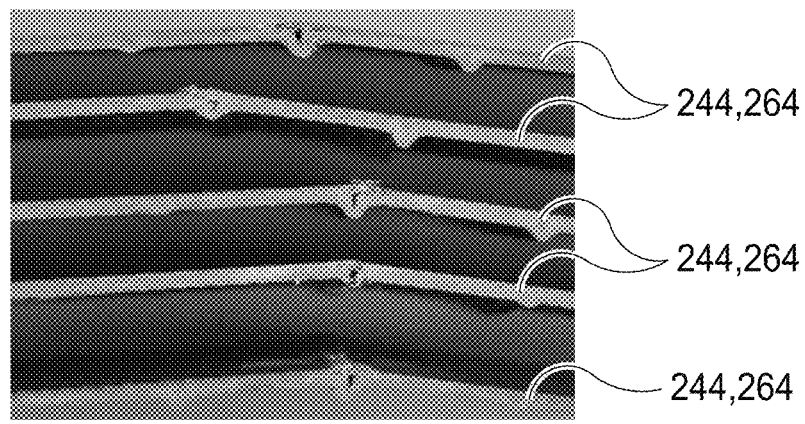
FIG. 8 is a photograph of the free edge of coupons with cracked outward wrinkles in accordance with exemplary embodiments of the present disclosure.

Digital Image Correlation (DIC) is an optical (non-contact) true full-field approach that can be used to map stress levels on the free edge of the coupon 244, 264 during tensile testing. DIC imaging allows for further understanding of failure mechanisms and interlaminar stresses. An embodiment includes measuring tension or tensile strain, inter-laminar tension, inter-laminar shear, and other physical and functional properties of the wrinkle defect in the coupon 244, 264 using DIC imaging or other conventional equipment. Tension loads in the composite in the dominant direction of the fiber in the testing apparatus 290, as shown in FIG. 7A. Inter-laminar tension measures the force needed to pull the individual plies apart. Inter-laminar shear measures the shear between ply layers in the composite. In an embodiment, pixelated paint can be applied to the free edge of the coupons 244, 264 and viewed with a camera having a strain gauge software to evaluate tension, inter-laminar tension, and inter-laminar shear. FIGS. 7B, 7C, and 7D are DIC images of the free edge of a coupon with an inward wrinkle made according to the method disclosed in FIG. 6A under increasing load tension in the testing apparatus 290. FIG. 7B is shown with the least load, FIG. 7C shows the coupon with more load than FIG. 7B, and FIG. 7D with the most load initiating a crack in the wrinkle pocket. DIC imaging can be used to map wrinkle initiation and growth as shown in FIGS. 7B-7D. FIG. 8 shows the free edges of cracked coupons 244, 264 with outward wrinkles after tension testing in testing apparatus 290.

In an embodiment, after the data from the DIC images is assessed, a wrinkle or a plurality of wrinkles having a predetermined characteristics in the coupons 244, 246 can be evaluated using finite element analysis (FEA). A generic FEA model can be developed with the equivalent AR or other characteristic as shown in the DIC images. Fiber distortion can be modeled using FEA as it progresses similarly to the images shown in FIGS. 7B, 7C, and 7D to further assess performance metrics of a wrinkle defect.

The performance data can be used to generate an allowable wrinkle defect profile based on coupons 244, 264 from a plurality of specimens. In an embodiment, standard A basis statistical confidence can be applied to the standard deviation of the performance data, which can produce a curve that captures the ultimate strength of the wrinkles with a high degree of confidence. From there, the ultimate strength can be reduced by an applicable limit factor based on component use or certification authority. In one embodiment, a limit strength curve can be used to evaluate the strength reduction in a discrepant part and determine a structural margin of safety. These curves are specific to laminate coupon thickness and the laminate material tested and can be used to generate an allowable wrinkle defect profile.

FIGS. 9A and 9B are cross-sectional images of specimens with outward wrinkles with predetermined characteristics. FIGS. 9A and 9B have outward wrinkle depths of about 25% and 50%, respectively of the total depth of the composite. FIG. 9A has an AR of about 1.0 and FIG. 9B has an AR of about 2.5. Measuring the predetermined wrinkle characteristics, such as, but not for limitation, shape, depth, length, etc. and correlating the predetermined wrinkle characteristic to strength or other performance data can be used to generate an allowable wrinkle defect profile. The wrinkles shown in FIGS. 9A and 9B had similar normalized strength values. It was surprisingly found that for outward wrinkles, the wrinkle depth can have an impact on strength reduction for ARs less than 1.0. This result is surprising in that it has been theorized that wrinkle strength reduction is directly correlated with wrinkle depth. Measuring the performance metrics for the predetermined wrinkle defects in coupons such as those shown in FIGS. 9A and 9B can be used to generate performance data.

In an embodiment, relating to the exemplary embodiments in FIGS. 6A-6B and 7A-10, an allowable wrinkle defect profile can be a matrix of material allowables for composite components, such as a spar for a rotor blade 105. The matrix of material allowables can be based on performance data from the coupons 244, 246 made from the methods shown in FIGS. 5, 6A, and 6B and can include at least one of the following performance data: aspect ratio, strength, wrinkle height, and wrinkle length. The exemplary matrix of material allowables shown in FIG. 10 identifies a wrinkle depth percentage (affected thickness percentage) as compared to the normalized ultimate strength percent, which can be utilized to determine performance reduction for the composite component with a defect. In an embodiment, a wrinkle defect in a composite component can be measured and compared to the matrix of allowables in FIG. 10 to assess the composite component wrinkle defect for at least one of the following: strength, stiffness, flaw growth, performance, structural integrity, and service life. The matrix of material allowables can be used as a tool to evaluate various composite components with wrinkle defects for identifying whether the component should be put into service, repaired, or scrapped. In an embodiment, the matrix of material allowables can be particularly useful for composite components with a wrinkle defect in unpredictable locations and having unpredictable severity. Advantageously the performance loss of a composite component with a defect can be determined based on the predetermine wrinkle characteristics in a plurality of specimens, for example, and not limitation, wrinkle type, wrinkle depth, and wrinkle AR.

Figure 12:
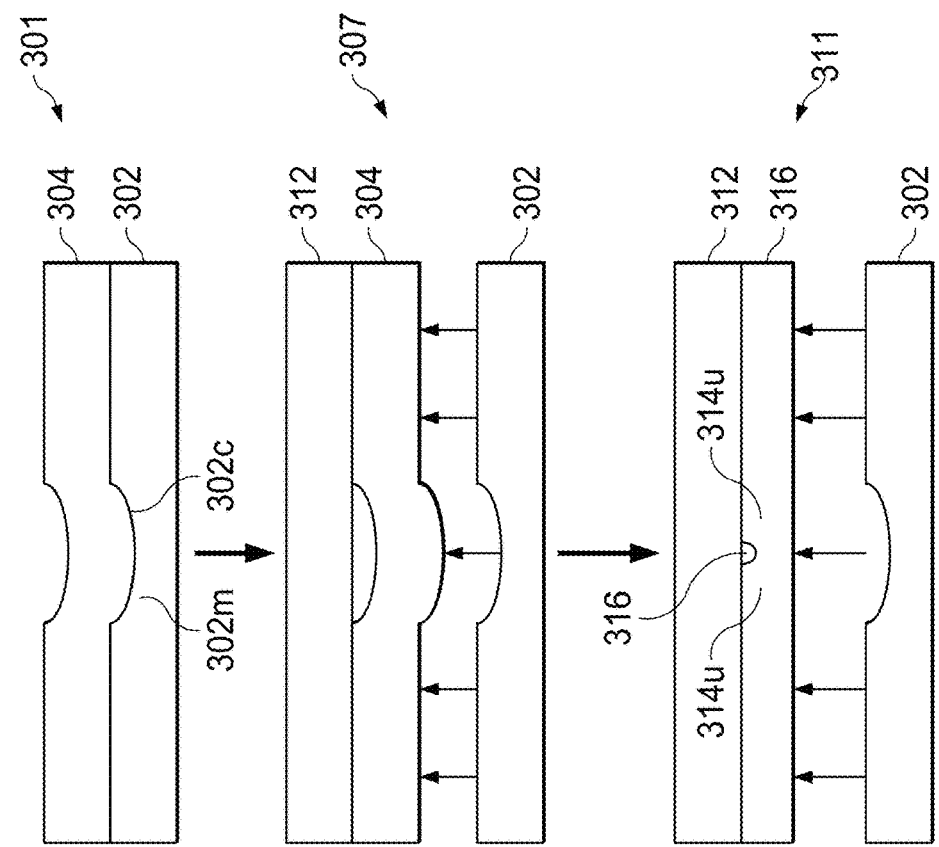
FIG. 12 is a schematic representation of a method of a making a tubular specimen with a predetermined wrinkle defect in accordance with exemplary embodiments of the present disclosure.
Figure 11:
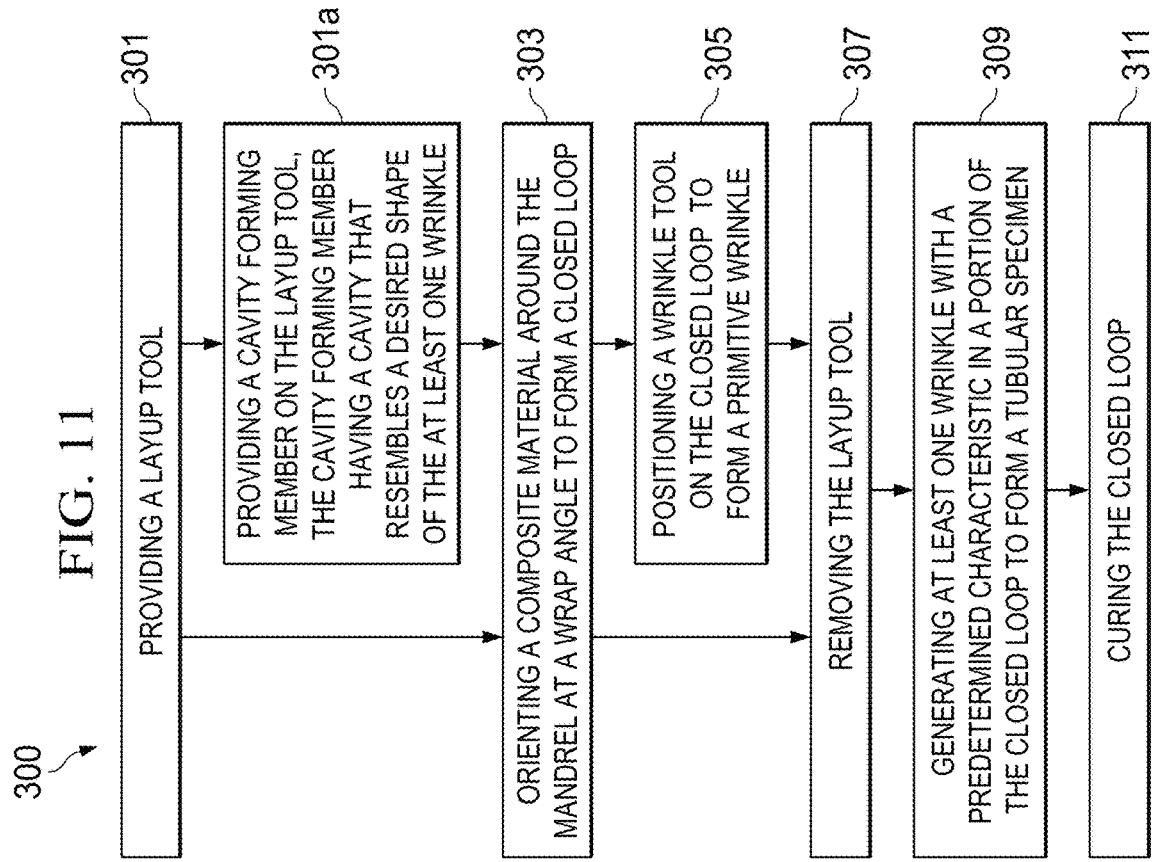
FIG. 11 is a flowchart illustrating a method of making a tubular specimen with a predetermined wrinkle defect in accordance with exemplary embodiments of the present disclosure.
Figure 14C:
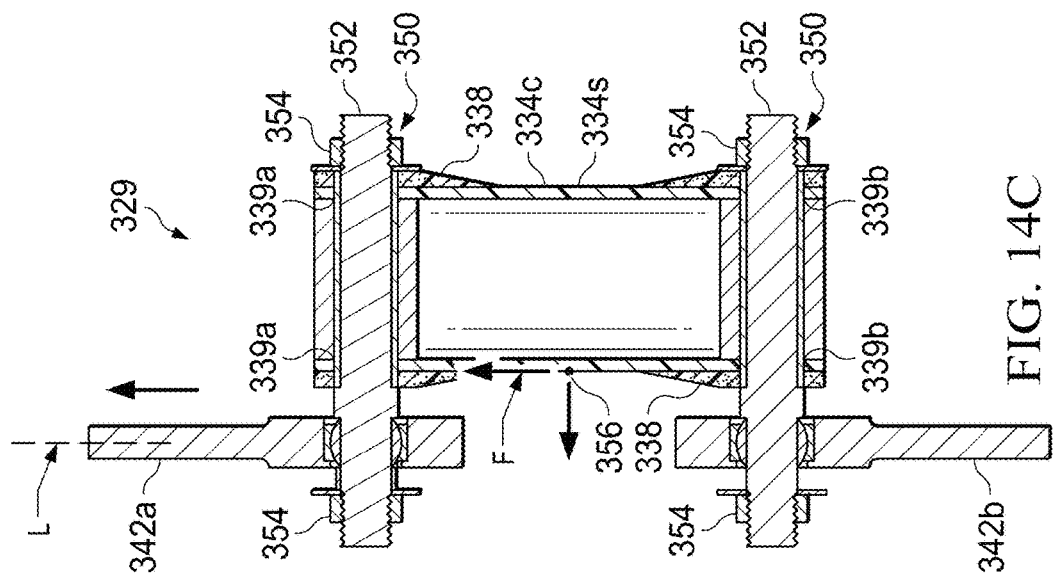
FIG. 14C is a cross-sectional view of the system for offset load testing of a tubular specimen in accordance with exemplary embodiments of the present disclosure.
Figure 14B:
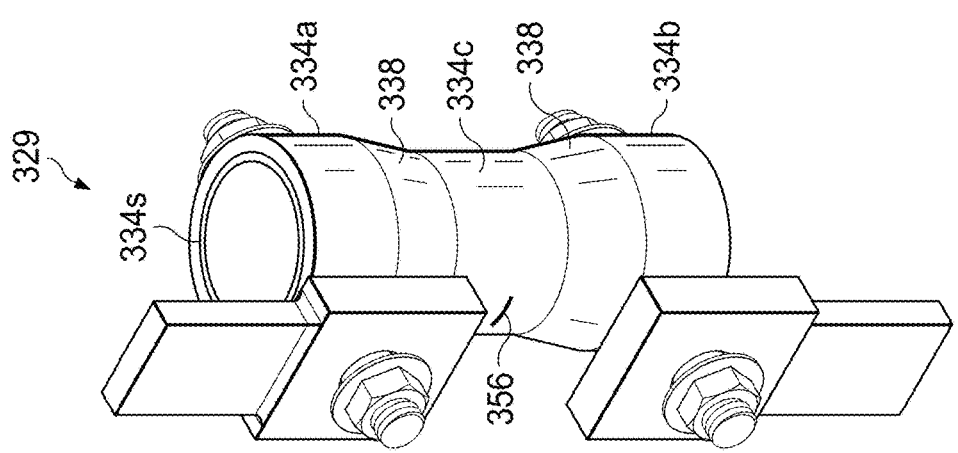
FIG. 14B is a perspective view of a system for offset load testing of a tubular specimen in accordance with exemplary embodiments of the present disclosure.
Figure 14A:
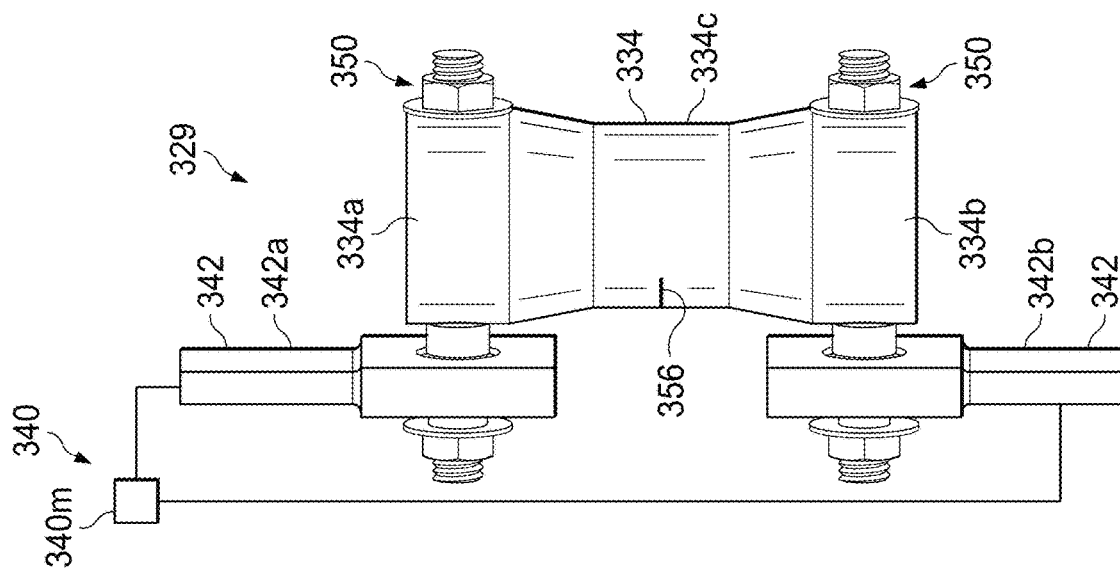
FIG. 14A is a side view of a system for offset load testing of a tubular specimen in accordance with exemplary embodiments of the present disclosure.
Figure 15:
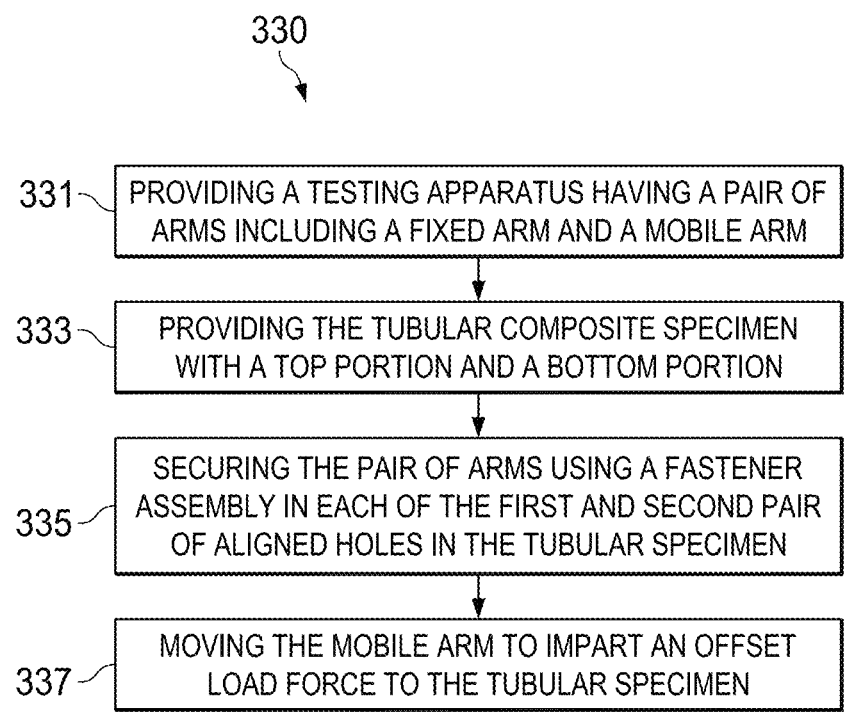
FIG. 15 is a flowchart illustrating a method of offset load testing a tubular composite specimen in accordance with exemplary embodiments of the present disclosure.

Referring now to FIGS. 11, 12, and 13, a method 300 of making a tubular specimen with a predetermined wrinkle defect is illustrated. In one embodiment, the method 300 is a method of making a composite specimen with a predetermined wrinkle defect from a composite material as described herein. The method 300 can include a step 301 of providing a layup tool 302; an optional step 301a of providing a cavity forming member 302m with a cavity 302c which resembles a desired shape of the at least one wrinkle; a step 303 of orienting a composite material around the layup tool 302 at a wrap angle to form a closed loop 304; an optional step 305 of positioning a wrinkle tool 306 on the closed loop 304 to form a primitive wrinkle 316p; a step 307 of removing the layup tool; and a step 309 of generating at least one wrinkle 316 with a predetermined characteristic in a portion of the closed loop 304 to form a tubular specimen 314. The predetermined characteristic of the wrinkle 316 can be at least one of the following: wrinkle location, an outward wrinkle, an inward wrinkle, a wrinkle width, a wrinkle height, and a wrinkle length. The method 300 includes at least one of the following steps to assisting in generating at least one wrinkle: step 301a and step 305a. The tubular specimen 314 advantageously provides a specimen with no free edge, so there is no edge effect, which is helpful when a composite component with rounded shape has a defect, e.g., the composite component with a defect has no edge that can be measured with an edge effect method (as described herein and shown in FIGS. 7A-7D and 8).

In one embodiment, the method 300 is a method of making a tubular composite specimen with a predetermined wrinkle defect from a composite material can be as described herein with respect to method 200 without the step 209 of cutting the coupons.

The step 301 can include providing a layup tool 302. The step 301 can further include the step 301 of providing a cavity forming member 302m onto or into the layup tool 302. In one embodiment, the layup tool 302 can have a tubular mandrel shape with a cavity forming member 302m and a forming surface 302f. The cavity forming member 302m can be integral to and formed into the layup tool 302, as shown in FIG. 12, or separate from the layup tool 302, as shown in FIG. 13. In an embodiment, the cavity forming member 302m and forming surface 302f is shown as a separate accessory in FIG. 13 that can be moved to the desired location on the layup tool 302 to achieve a predetermined characteristic. As shown in FIG. 13, the cavity forming member 302m includes a cavity 302c that resembles a desired shape of the at least one wrinkle 316 having a predetermined characteristic. The cavity 302c can be a slot or other suitable shape for achieving the desired shape and other predetermined characteristic of the at least one wrinkle 316. The cavity forming member 302m on the layup tool in step 301a can assist in generating a primitive wrinkle 316p on the interior surface of the tubular specimen 314.

In an embodiment, the step 301 of providing a layup tool 302 does not include providing a cavity forming member 302m. This embodiment can be used when the wrinkle to be generated is not on the interior surface of the tubular specimen 314 and instead is located on an exterior surface of the tubular specimen 314.

The step 303 includes orienting a composite material at a wrap angle around the layup tool to form a closed loop can be as described with respect to method 200. In an embodiment, the composite material includes 24 plies having 6 sets of plies at the following wrap angles: a −45 degrees ply, a +45 degrees ply, a 0 degrees ply, and a 90 degrees ply. The closed loop 304 can have a generally circular cross-sectional shape. In other embodiments, the closed loop 304 can have an elliptical, oval, flat oval, or other generally tubular cross-sectional shape.

The step 305 can include positioning a wrinkle tool 306 on the closed loop 304. In an embodiment, the wrinkle tool 306 is a piece of wire temporarily adhered to a surface of the closed loop 304 as shown in FIG. 13. Other devices or equipment that achieve the desired shape of the primitive wrinkle 316p can be used as wrinkle tool 306; for example, and not limitation, a punch device, a screw driver, paper clip, a piece of rope, a piece of plastic string, one or more strings of yarn, round cross-sectional shaped objects, and bell cross-sectional shaped objects. In an embodiment, the wrinkle tool 306 mates with the cavity 302c.

In an embodiment, the step 307 of removing the layup tool 302 can include blowing closed loop 304 with air from the forming surface 302f of the layup tool 302.

In embodiment, the step 309 of generating at least one wrinkle 316 can include a step 305 of deforming a portion of the closed loop 304 around the wrinkle tool 306 to create an imprint of the wrinkle tool in the closed loop 304 that is identified as a primitive wrinkle 316p; and/or a step 311 of curing the closed loop to generate at least one wrinkle 316. The step 311 of curing can include compacting the closed loop 304 with a cure tool 312. In an embodiment, the compacting of the closed loop 304 with the cure tool 312 forms the wrinkle 316 with a predetermined characteristic in the specimen 314. The cure tool 312 can be a mold or other shape controlling apparatus used during the curing 311 step.

In an embodiment, after the generating a wrinkle step 309, the specimen 314 includes an unwrinkled portion 314u adjacent to the wrinkled portion. In an embodiment shown in FIG. 12, the unwrinkled portion 314u are layers below the wrinkle 316. In other embodiments, the unwrinkled portion 314u are layers above the wrinkle 316. In another embodiment shown in FIG. 13, the unwrinkled portion 314u can be located laterally or around the wrinkle 316.

It will be appreciated that the contemplated embodiment shown in FIGS. 11, 12, and 13 is configured showing the cavity forming member 302m on the layup tool 302 and the wrinkle tool 306 on the closed loop. In other embodiments, the cavity forming member 302m can be positioned on at least one of the following: the closed loop 304 and the curing surface 312s of the cure tool 312. In another embodiment, the wrinkle tool 306 can be positioned on at least one of the following: the forming surface 302f of the layup tool 302 and the curing surface 312s of the cure tool 312. In yet another embodiment, the method 300 includes only one of the cavity forming member 302m and the wrinkle tool 306 to generate a wrinkle with a predetermined characteristic.

A system 329 and method 330 of offset load testing a tubular composite specimen 334 having at least one wrinkle defect 356 are shown in FIGS. 14A-14C and 15. The system of offset load testing a tubular composite specimen 334 can include a tubular composite specimen 334, a pair of fastener assemblies 350, and a pair of arms 342 of the testing apparatus 340. The tubular composite specimen 334 has a top portion 334a and a bottom portion 334b and at least one wrinkle defect 356 in a center portion 334c. The top and bottom portions 334a, 334b each include a plurality of reinforcement layers 338, which in one exemplary embodiment are fiberglass layers. The top and bottom portions 334a, 334b can each have a pair of aligned holes 339a, 339b so that each can receive a fastener assembly 350. The fastener assembly 350 is connected to the pair of arms 342 on a testing apparatus 340.

The method 330 of offset load testing a tubular composite specimen 334 can include the following steps: a step 331 of providing a testing apparatus 340 having a pair of arms 342 including a mobile arm 342a and a fixed arm 342b; a step 333 of providing the tubular composite specimen 334 with a top portion 334a and a bottom portion 334b; a step 335 of securing the pair of arms 342 to the top 334a and bottom portion 334b of the tubular specimen 334; and the step 337 of moving the mobile arm 342a to impart an offset load force F to the tubular specimen 334.

An embodiment advantageously provides that the testing apparatus 340 can be a standard tensile and/or compressive testing machine, or a multiple-axis testing machine, e.g. a tension-torsion testing machine. The testing apparatus 340 includes an actuating mechanism 340m mechanically connected to at least one of the pair of arms 342. In an embodiment, the actuating mechanism 340m moves the mobile arm 342a in an upward or downward direction.

In an embodiment, the tubular composite specimen 334 can include a tubular specimen 334s made according to the method 300 that includes at least one wrinkle defect 356 with a predetermined characteristic. The tubular composite specimen 334 can include top and bottom portions 334a, 334b with a plurality of reinforcement layers 338 around the tubular specimen 334s. The plurality of reinforcement layers 338 can be multiple woven fiberglass plies to structurally reinforce the tubular composite specimen 334 during the moving step 337. The plurality of reinforcement layers 338 prevent the tubular composite specimen 334 from bending in the top and bottom portions 334a, 334b during the moving step 337.

In an embodiment, the step 335 of securing the arms 342 to the tubular composite specimen 334 can include connecting a fastener assembly 350 to each of the top and bottom portions 334a, 334b of the tubular composite specimen 334. In one embodiment, shown in FIGS. 14A, 14B, and 14C, each of the top and bottom portions 334a, 334b of the tubular composite specimen 334 respectively includes a first and second pair of aligned holes 339a, 339b. The fastener assembly 350 can be secured in each of the first and second pair of aligned holes 339a, 339b and can include a round rod 352 and securing fasteners 354. In an embodiment, the round rod 342 is oriented generally about 90 degrees from the longitudinal axis of the mobile arm and can be a bushing. The round rod 352 is secured to the pair of arms 342 and the tubular composite specimen 334 using the securing fasteners 354, which can be for example, and not limitation, conventional fasteners such as washers, bolts.

The fastener assembly 350 is securely fastened to the top and bottom portions 334a, 334b of the tubular composite specimen 334. When the mobile arm 342a is connected to the top portion 334a and the mobile arm 342a is moved upward or downward, the upward or downward force causes the middle of the tubular composite specimen 334 to bend, which can cause bending forces at the wrinkle 356. The physical characteristics can be measured at the middle of the tubular composite specimen 334 to bend and the forces at the winkle 356 to generate performance metrics.

Method 330 can be practiced with a tubular composite specimen 334 including at least one of the following defects: a wrinkle, a delamination, a void, a fiber pull-out, a foreign body, a fiber misalignment, a marcelle, a waviness feature, and impact damage. A marcelle can be a ply waviness that can be several times the nominal ply thickness.

Figure 16A:
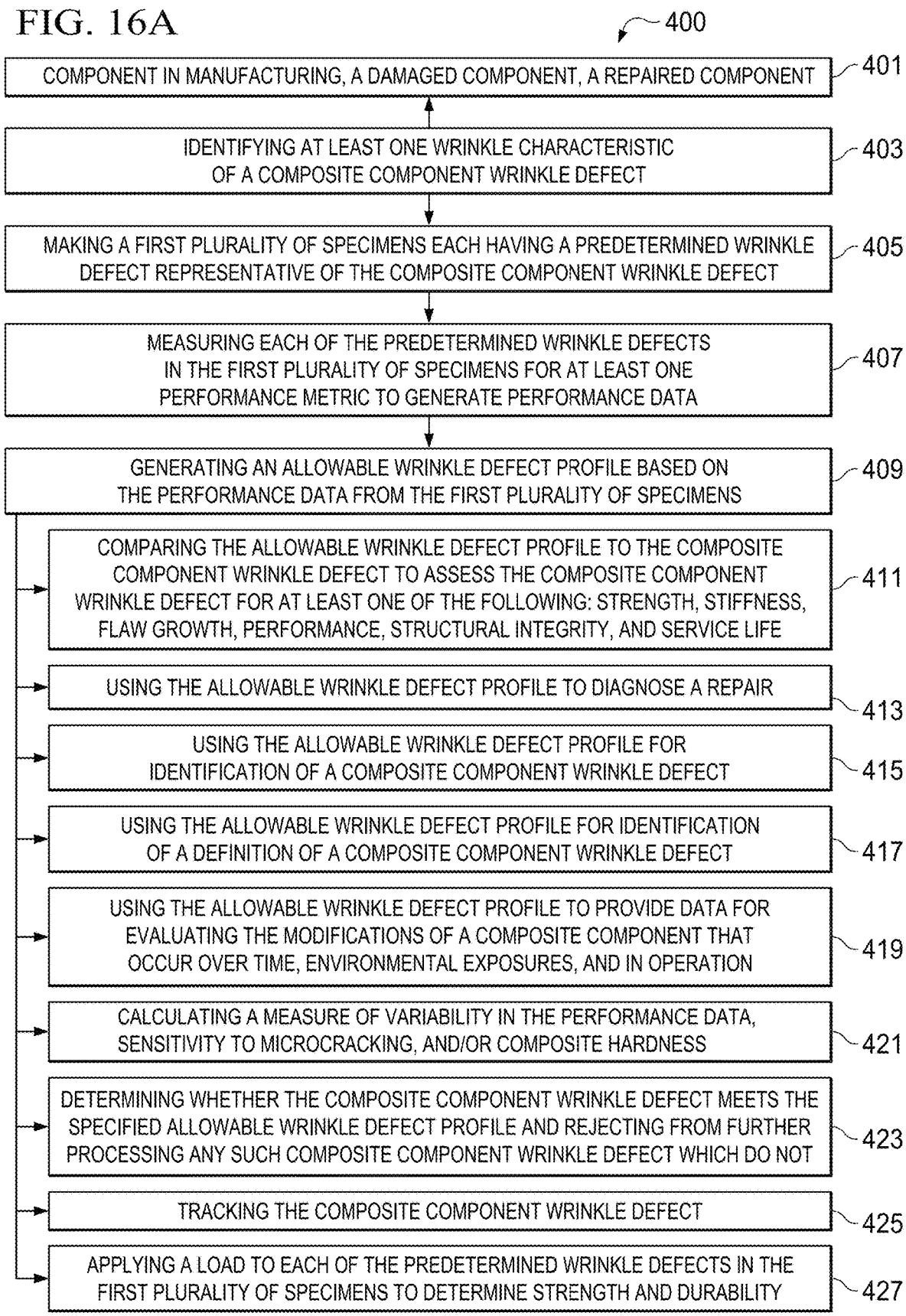
FIGS. 16A and 16B are flowcharts illustrating methods of determining allowable defects for a composite component in accordance with exemplary embodiments of the present disclosure.

Referring now to FIG. 16A, a method 400 of determining allowable defects for a composite component includes a step 401 of identifying at least one wrinkle characteristic of a composite component wrinkle defect; a step 403 of making a first plurality of specimens each having a predetermined wrinkle defect representative of the composite component wrinkle defect; a step 405 of measuring each of the predetermined wrinkle defects in the first plurality of specimens for at least one performance metric to generate performance data; and a step 407 of generating an allowable wrinkle defect profile based on the performance data from the first plurality of specimens.

In an embodiment, the composite component can be a spar for a rotor blade, a rotor blade grip, a tiltrotor pylon support, a wing spar, and other composite components having manufacturing or repair defects.

In an embodiment, the method 400 further includes comparing the allowable wrinkle defect profile to the composite component wrinkle defect to assess the composite component wrinkle defect for at least one of the following: strength, stiffness, flaw growth, performance, structural integrity, and service life.

The method 400 in an embodiment can include the predetermined wrinkle defect having at least one predetermined physical characteristic representative of a physical characteristic of the composite component wrinkle. The predetermined physical characteristic and physical characteristic can each be similar and are each at least one of the following: a wrinkle location, an outward wrinkle, an inward wrinkle, a wrinkle width, a wrinkle height, and a wrinkle length.

In an embodiment, the measuring step 407 can include measuring at least one of the following: tension, inter-laminar tension, inter-laminar shear, compression, and bending.

In an embodiment, the performance metric is at least one of the following: strength, stiffness, and flaw growth.

In an embodiment, the method 400 can include using the allowable wrinkle defect profile to diagnose a repair. In one embodiment, the repair can be at least one of the following: a patch repair, a blend repair, a bond repair, a secondary bonded patch, and a scarf repair. A patch repair includes providing a patching material over a defect area. A blend repair involves improving properties of the composite component by removing material near or at the defect area. A scarf repair involves removing material to provide an exposed surface on or in the composite and adding material to the exposed area. A secondary bonded patch can be the joining together, by the process of adhesive bonding, two or more pre-cured composite parts, during which the chemical or thermal reaction occurring is the curing of the adhesive itself.

In a further embodiment, the method 400 can include using the allowable wrinkle defect profile for identification of a composite component wrinkle defect.

In yet another embodiment, the method 400 can include using the allowable wrinkle defect profile for identification of a definition of a composite component wrinkle defect.

In an embodiment, the composite component wrinkle defect is at least one of the following: a component in manufacturing, a damaged component, and a repaired component.

The allowable wrinkle defect profile can provide data for evaluating the modifications of a composite component that occur over time, environmental exposures, and in operation.

The method 400 can further include calculating a measure of variability in the performance data.

The method 400 can further include determining whether the composite component wrinkle defect meets the specified allowable wrinkle defect profile and rejecting from further processing any such composite component wrinkle defect which do not.

The method 400 can include tracking the composite component wrinkle defect.

In an embodiment, the method 400 can include applying a load to each of the predetermined wrinkle defects in the first plurality of specimens.

In an embodiment, the method 400 further includes making a second plurality of specimens each having a predetermined wrinkle defect representative of the composite component wrinkle defect; and measuring each of the predetermined wrinkle defects in the second plurality of specimens for at least one performance metric to generate performance data. The predetermined wrinkle defect in each of the second plurality of specimens can be different from the predetermined wrinkle defect in each of the first plurality of specimens. In another embodiment, the predetermined wrinkle defect in each of the second plurality of specimens is substantially similar to the predetermined wrinkle defect in each of the first plurality of specimens. In an embodiment, the second plurality of specimens are tubular specimens.

Figure 16B:
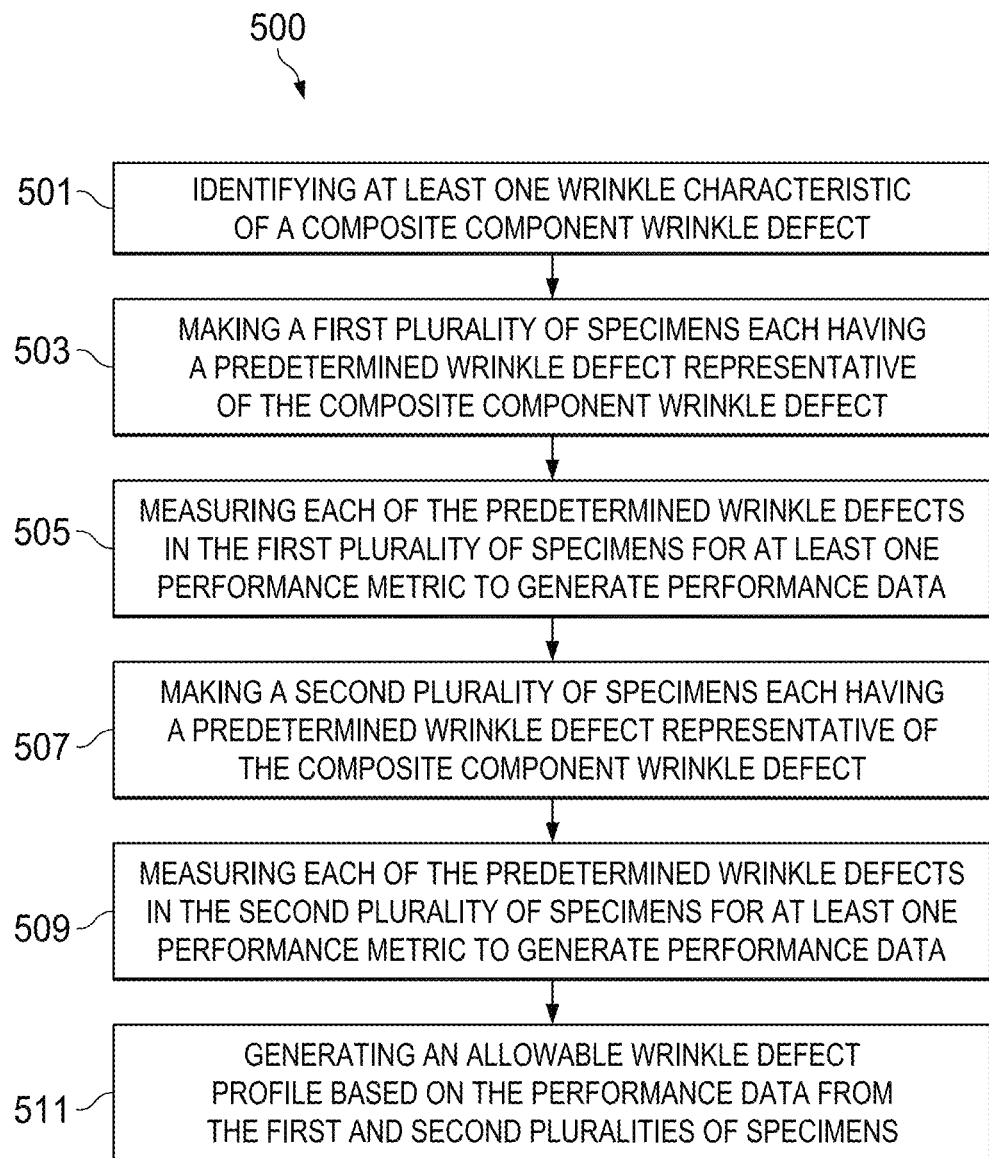

Referring now to FIG. 16B, a method 500 of determined allowable defects for a composite component includes a step 501 of identifying at least one wrinkle characteristic of a composite component wrinkle defect, a step 503 of making a first plurality of specimens each having a predetermined wrinkle defect representative of the composite component wrinkle defect, a step 505 of measuring each of the predetermined wrinkle defects in the first plurality of specimens for at least one performance metric to generate performance data, a step 507 of making a second plurality of specimens each having a predetermined wrinkle defect representative of the composite component wrinkle defect, a step 509 of measuring each of the predetermined wrinkle defects in the second plurality of specimens for at least one performance metric to generate performance data, and a step of 511 generating an allowable wrinkle defect profile based on the performance data from the first and second pluralities of specimens. In one embodiment, the first plurality of specimens can be made according to at least one of the method 200 shown in FIG. 5, the method shown in FIG. 6A, the method shown in FIG. 6B, and the method shown in FIGS. 6C and 6D. In an embodiment, the second plurality of specimens can be made according to the method 300 shown in FIGS. 11, 12, and 13.

Figure 16C:
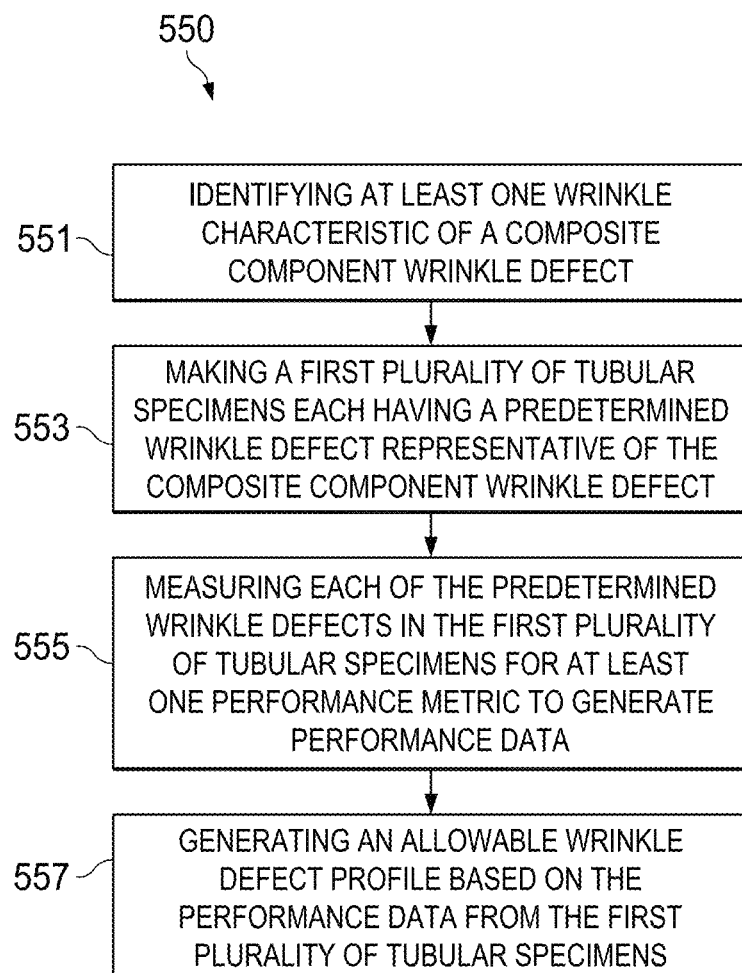
FIG. 16C is a flowchart illustrating a method of determining allowable defects for a tubular composite component in accordance with exemplary embodiments of the present disclosure.

Referring now to FIG. 16C, a method 550 of determining allowable defects for a composite component includes a step 551 of identifying at least one wrinkle characteristic of a composite component wrinkle defect; a step 553 of making a first plurality of tubular specimens each having a predetermined wrinkle defect representative of the composite component wrinkle defect; a step 555 of measuring each of the predetermined wrinkle defects in the first plurality of tubular specimens for at least one performance metric to generate performance data; and a step 557 of generating an allowable wrinkle defect profile based on the performance data from the first plurality of tubular specimens.

The methods and systems described herein can advantageously provide at least one of the following: an improved method of manufacturing consistent defects in composite specimens; an embodiment of the composite specimen with a predetermined wrinkle defect that can be tested in a conventional tensile testing machine, which provides greater standardization and does not require a custom testing machine; the ability to control the shape, size, severity, and other characteristics of a wrinkle defect in a composite specimen; and an industry standard for measuring effects of wrinkles and other defects; and for coupon level testing with representative attributes to an actual composite structure with a defect that is directly comparable to structural design allowables.

It will be appreciated that the embodiments are configured for wrinkle defects in composite components. In additional contemplated embodiments, the methods and systems described herein can be used for composite components having a composite component defect being at least one of the following: a wrinkle, a void, gross porosity, a delamination, a fiber pull-out, a foreign body, a fiber misalignment, an undesirable waviness feature, an in-plane fiber distortion (Marcel), missing plies, and impact damage. The methods of making specimens can be used to manufacture other non-wrinkle or wrinkle related defects. Accordingly, the predetermined defect in the specimen can have at least one predetermined physical characteristic representative of a physical characteristic of the composite component defect.

The foregoing description of embodiments of the disclosure has been presented for purposes of illustration and description. It is not intended to be exhaustive or to limit the disclosure to the precise form disclosed, and modifications and variations are possible in light of the above teachings or may be acquired from practice of the disclosure. The embodiments were chosen and described in order to explain the principals of the disclosure and its practical application to enable one skilled in the art to utilize the disclosure in various embodiments and with various modifications as are suited to the particular use contemplated. Other substitutions, modifications, changes and omissions may be made in the design, operating conditions and arrangement of the embodiments without departing from the scope of the present disclosure. Such modifications and combinations of the illustrative embodiments as well as other embodiments will be apparent to persons skilled in the art upon reference to the description. It is, therefore, intended that the appended claims encompass any such modifications or embodiments.

What is claimed is:

1. A method of offset load testing a tubular composite specimen having at least one wrinkle defect, the method comprising:
providing a testing apparatus having a pair of arms including a fixed arm and a mobile arm, each of the fixed arm and the mobile arm including a fastener assembly;
providing the tubular composite specimen with a top portion with a first pair of aligned holes, a bottom portion with a second pair of aligned holes, and a center portion disposed between the top portion and the bottom portion, the top and bottom portions each include a plurality of reinforcement layers comprising fiberglass plies, the center portion including at least one wrinkle defect;
securing the pair of arms using the respective fastener assembly in each of the first and second pair of aligned holes in the tubular composite specimen; and
moving the mobile arm to impart an offset force to the center portion of the tubular composite specimen;
wherein the plurality of reinforcement layers prevent the tubular composite specimen from bending in the top and bottom portions during the moving step.

2. The method according to claim 1, wherein the testing apparatus is at least one of the following: a tensile testing machine, a compressive testing machine, and a tension-torsion testing machine.

3. The method according to claim 1, wherein the at least one wrinkle defect comprises an out of plane distortion of an element of a composite fiber.

4. The method according to claim 1, wherein the method further comprises:

generating at least one wrinkle defect in the tubular specimen with a predetermined characteristic.

5. The method according to claim 1, wherein the fastener assembly in the securing step is oriented about 90 degrees from a longitudinal axis of the mobile arm.

6. The method according to claim 1, wherein the fastener assembly comprises a round rod disposed in the respective first or second pair of aligned holes and a securing fastener for securing the round rod in the respective first or second pair of aligned holes.

7. The method according to claim 1, wherein the moving of the mobile arm bends the center portion of the tubular composite specimen.

* * * * *